US012660321B2

(12) United States Patent
Yoon et al.

(10) Patent No.: US 12,660,321 B2
(45) Date of Patent: Jun. 16, 2026

(54) DISPLAY DEVICE

(71) Applicant: Samsung Display Co., LTD., Yongin-si (KR)

(72) Inventors: Jongchul Yoon, Yongin-si (KR); Sungho Kim, Yongin-si (KR); Woonghee Jeong, Yongin-si (KR); Nuree Um, Yongin-si (KR); Yu-Jin Jeon, Yongin-si (KR); Jaewon Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 362 days.

(21) Appl. No.: 18/364,571

(22) Filed: Aug. 3, 2023

(65) Prior Publication Data

US 2024/0113136 A1 Apr. 4, 2024

(30) Foreign Application Priority Data

Oct. 4, 2022 (KR) ........................ 10-2022-0126000

(51) Int. Cl.
   H10D 86/60 (2025.01)
   H10D 86/40 (2025.01)
(52) U.S. Cl.
   CPC ........... H10D 86/60 (2025.01); H10D 86/451 (2025.01); H10D 86/441 (2025.01); H10D 86/481 (2025.01)

(58) Field of Classification Search
   CPC ...... H10D 86/60; H10D 86/451; H10D 86/40; H10D 86/441; H10D 86/481; H10D 86/423; H10K 59/805; H10K 59/80; H10K 59/1213; H10K 59/121; H10K 59/1216; H10K 59/123; H10K 59/131; H10H 29/142; H10H 29/14; H10H 29/32; H10H 20/83; H10H 20/852; H10H 20/857; H10H 20/032
   See application file for complete search history.

(56) References Cited

U.S. PATENT DOCUMENTS

| 10,622,430 B2 | 4/2020 | Jeong et al. |
| 10,998,393 B2 | 5/2021 | Jeong et al. |

FOREIGN PATENT DOCUMENTS

| KR | 10-1482627 | 1/2015 |
| KR | 10-2016-0150199 | 12/2016 |
| KR | 10-2021-0037059 | 4/2021 |
| KR | 10-2022-0022013 | 2/2022 |

*Primary Examiner* — Nikolay K Yushin
(74) *Attorney, Agent, or Firm* — F. CHAU & ASSOCIATES, LLC

(57) ABSTRACT

A display device includes a first electrode disposed on a substrate and extending in a first direction, a via insulating layer disposed on the first electrode and including an opening exposing at least a portion of the first electrode, and a second electrode disposed on the first electrode and the via insulating layer and overlapping the first electrode in the opening.

20 Claims, 19 Drawing Sheets

ILD1

DISPLAY DEVICE

CROSS-REFERENCE TO RELATED APPLICATION(S)

This application claims priority to and benefits of Korean Patent Application No. 10-2022-0126000 under 35 U.S.C. § 119, filed on Oct. 4, 2022 in the Korean Intellectual Property Office (KIPO), the entire contents of which are incorporated herein by reference.

BACKGROUND

1. Technical Field

Embodiments relate to a display device including a storage capacitor.

2. Description of the Related Art

A display device includes multiple pixels. Each of the pixels may include multiple transistors and a light emitting element electrically connected to the transistors. The transistors may be turned on in response to signals provided through lines, and a predetermined or selected driving current may be generated accordingly, and the light emitting element may emit light in response to the driving current.

The number of transistors and capacitors electrically connected to a light emitting element is increasing in order to accurately control whether or not the light emitting element emits light and the degree of light emission. Accordingly, research is being actively conducted to solve problems of high integration of display devices and power consumption.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device with improved display quality.

A display device according to an embodiment of the disclosure may include a first electrode disposed on a substrate and extending in a first direction, a via insulating layer disposed on the first electrode and including an opening exposing at least a portion of the first electrode, and a second electrode disposed on the first electrode and the via insulating layer and overlapping the first electrode in the opening.

In an embodiment, the display device may further include a scan line disposed between the substrate and the first electrode and extending in a second direction intersecting the first direction. The scan line may intersect the first electrode in plan view.

In an embodiment, the opening may extend in the first direction.

In an embodiment, the opening may intersect the scan line in plan view.

In an embodiment, the display device may further include a passivation layer disposed on the first electrode and overlapping the first electrode.

In an embodiment, the second electrode may contact the passivation layer in the opening.

In an embodiment, the display device may further include a gate electrode disposed on the substrate, and a capacitor electrode disposed on the gate electrode. The first electrode may overlap the gate electrode and the capacitor electrode.

In an embodiment, the display device may further include an insulating layer disposed on the gate electrode and overlapping the gate electrode, a first active pattern disposed between the substrate and the gate electrode, and a second active pattern disposed between the insulating layer and the first electrode.

In an embodiment, the first active pattern may include a silicon semiconductor, and the second active pattern may include an oxide semiconductor.

In an embodiment, the display device may further include a lower pattern disposed between the substrate and the first active pattern.

A display device according to an embodiment of the disclosure may include a first electrode disposed on a substrate and extending in a first direction, a second electrode disposed on the substrate and spaced apart from the first electrode in a second direction intersecting the first direction, a via insulating layer disposed on the first electrode and the second electrode, exposing at least a portion of each of the first electrode and the second electrode, and including an opening including a U-shape in which a lower flat surface is cut off in plan view, and a third electrode disposed on the first electrode, the second electrode and the via insulating layer, and overlapping each of the first electrode and the second electrode in the opening.

In an embodiment, the opening may include a first opening extending in the first direction and exposing at least a portion of the first electrode, a second opening extending in the first direction, spaced apart from the first opening in the second direction, and exposing at least a portion of the second electrode, and a third opening extending in the second direction, exposing at least a portion of each of the first electrode and the second electrode, and extending to the first opening and the second opening.

In an embodiment, the opening may extend from the first opening to the second opening along the third opening.

In an embodiment, the display device may further include a scan line disposed between the substrate and the first electrode and extending in the second direction. The scan line may intersect each of the first electrode and the second electrode in plan view.

In an embodiment, each of the first opening and the second opening may intersect the scan line in plan view.

In an embodiment, the display device may further include a passivation layer disposed on the first electrode and the second electrode and overlapping the first electrode and the second electrode.

In an embodiment, the third electrode may contact the passivation layer in the opening.

In an embodiment, the display device may further include a first gate electrode disposed on the substrate, a second gate electrode disposed on the substrate and spaced apart from the first gate electrode in the second direction, a first capacitor electrode disposed on the first gate electrode, and a second capacitor electrode disposed on the second gate electrode. The first electrode may overlap the first gate electrode and the first capacitor electrode, and the second electrode may overlap the second gate electrode and the second capacitor electrode.

In an embodiment, the display device may further include an insulating layer disposed on the first gate electrode and the second gate electrode and overlapping the first gate electrode and the second gate electrode.

In an embodiment, the display device may further include a first active pattern disposed between the substrate and the first gate electrode and including a silicon semiconductor, and a second active pattern disposed between the insulating layer and the first electrode and including an oxide semiconductor.

In a display device according to embodiments of the disclosure, the display device may include a gate connection electrode, a passivation layer, a first via insulating layer and a driving voltage line. As an opening exposing the passivation layer overlapping the gate connection electrode may be defined in the first via insulating layer, the gate connection electrode and the driving voltage line may overlap with the passivation layer interposed therebetween. Since the gate connection electrode and the driving voltage line may additionally form a storage capacitor, a capacity of a storage capacitor of a first transistor may be sufficiently secured. Accordingly, a voltage of the first transistor may be stabilized, and display quality of the display device may be improved.

BRIEF DESCRIPTION OF THE DRAWINGS

FIG. 13 is a schematic cross-sectional view taken along line I-I' of FIG. 11.

DETAILED DESCRIPTION OF THE EMBODIMENTS

Figure 1:
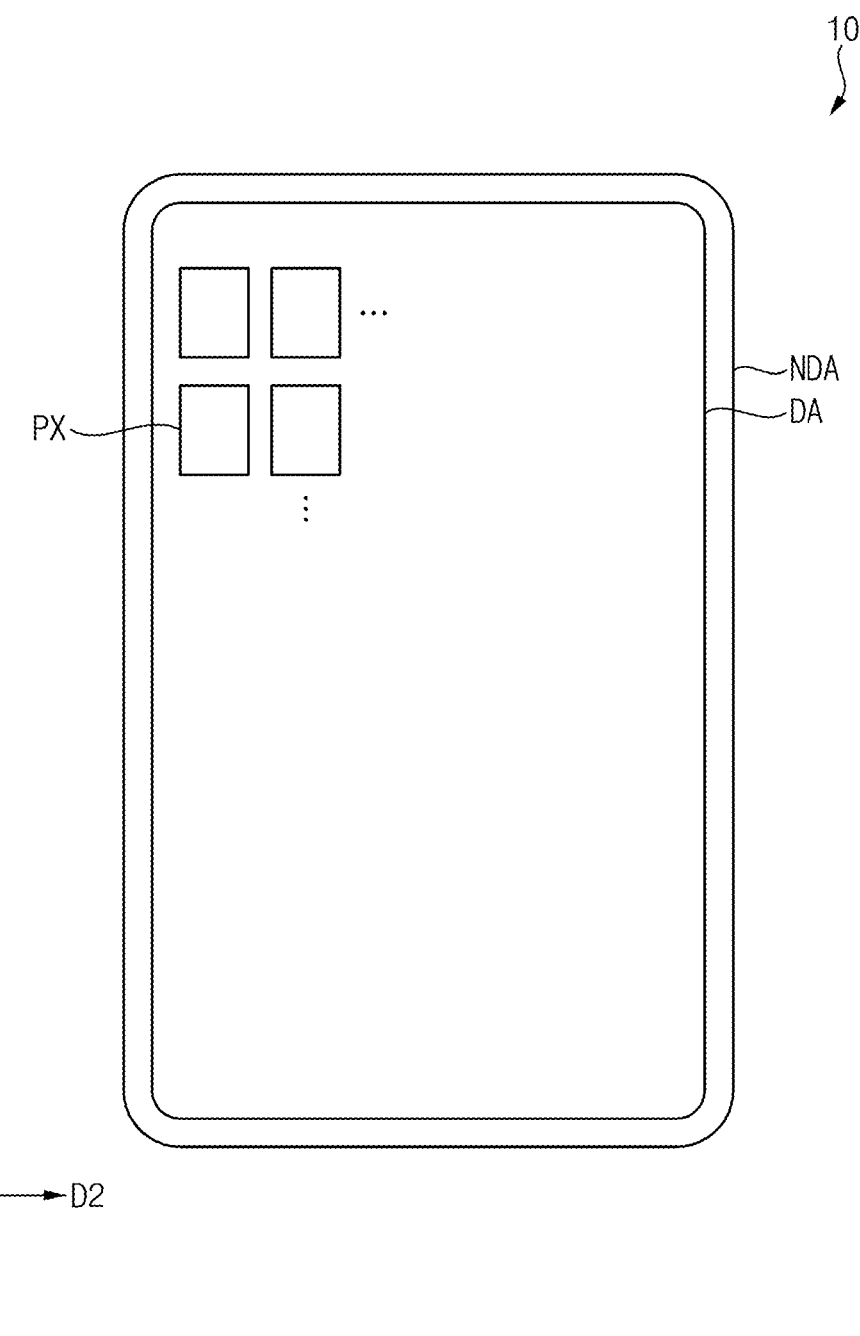
FIG. 1 is a schematic plan view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. The same reference numerals are used for the same components in the drawings, and redundant descriptions of the same components will be omitted.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that the terms "connected to" or "coupled to" may include a physical and/or electrical connection or coupling.

The term "intersecting" specifies a relationship between two or more directions and/or features whereby the directions and/or features are non-parallel to one another when view from a direction (e.g., in plan view). The term may include presence of or absence of contact between features. The term may include crossing, cutting across, traversing, spanning, or any other term as would be appreciated and understood by one of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment.

Referring to FIG. 1, a display device 10 according to an embodiment may include a display area DA and a non-display area NDA. The display area DA may be an area capable of displaying an image by generating light. The non-display area NDA may be an area not displaying an image. The non-display area NDA may surround at least a portion of the display area DA. For example, the non-display area NDA may entirely surround the display area DA.

At least one pixel PX that emits light may be disposed in the display area DA, and accordingly, an image may be displayed in the display area DA. The pixels PX may be arranged in a matrix form along a first direction D1 and a second direction D2 intersecting the first direction D1. For example, the second direction D2 may be orthogonal to the first direction D1.

Figure 2:
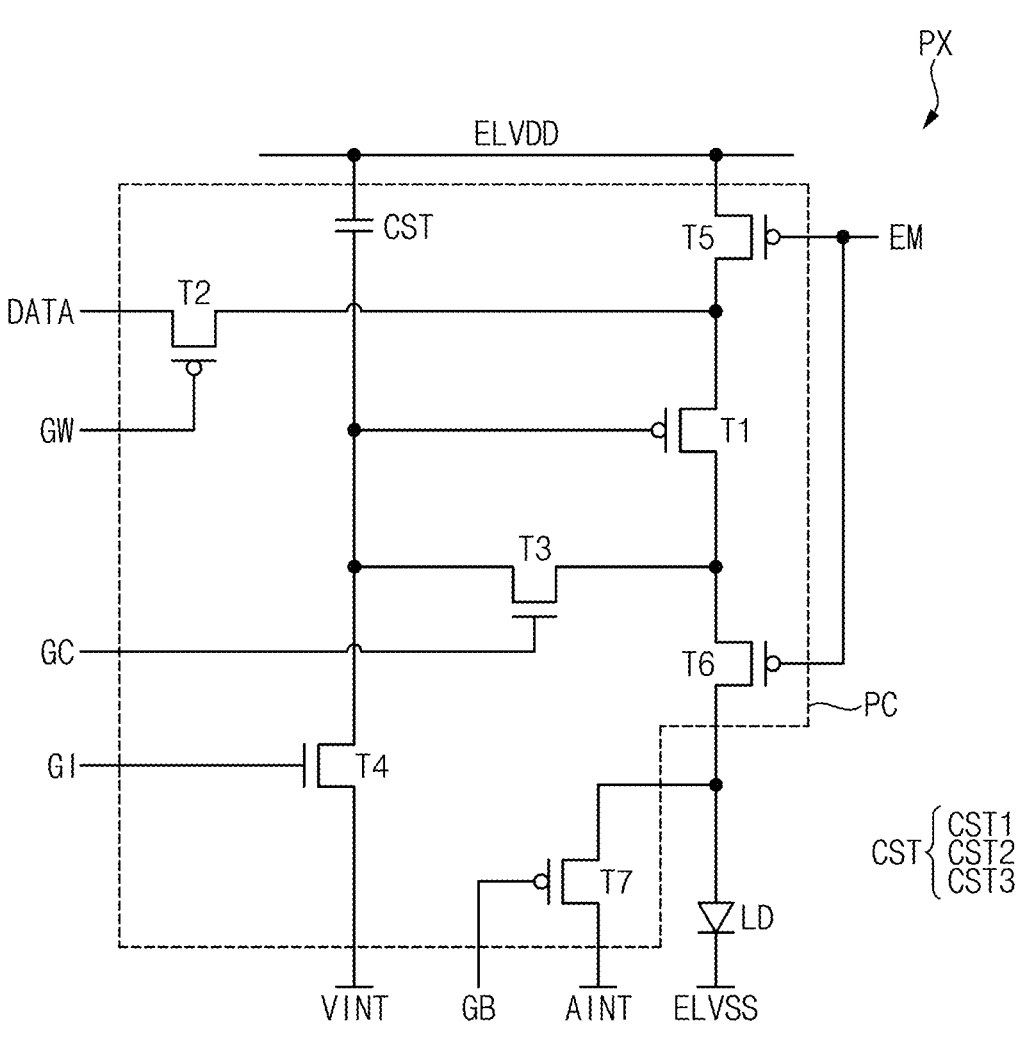
FIG. 2 is a schematic diagram of an equivalent circuit of a pixel included in the display device of FIG. 1.

FIG. 2 is a schematic diagram of an equivalent circuit of a pixel included in the display device of FIG. 1.

Referring to FIG. 2, the pixel PX may include a pixel circuit PC and a light emitting element LD. The pixel circuit PC may provide a driving current to the light emitting element LD, and the light emitting element LD may generate light based on the driving current.

The pixel circuit PC may include a first transistor T1, a second transistor T2, a third transistor T3, a fourth transistor T4, a fifth transistor T5, a sixth transistor T6, a seventh transistor T7 and a storage capacitor CST.

The light emitting element LD may include a first terminal (e.g., an anode terminal) and a second terminal (e.g., a cathode terminal). The first terminal of the light emitting element LD may be connected to the sixth transistor T6 and the seventh transistor T7, and the second terminal of the light emitting element LD may receive a common voltage ELVSS. The light emitting element LD may generate light having a luminance corresponding to the driving current.

The first transistor T1 may include a gate terminal, a first terminal (e.g., a source terminal), and a second terminal (e.g., a drain terminal). The gate terminal of the first transistor T1 may be connected to a first terminal of the storage capacitor CST. The first terminal of the first transistor T1 may be connected to the second transistor T2 and receive a data voltage DATA. The second terminal of the first transistor T1 may be connected to the sixth transistor T6. The first transistor T1 may generate the driving current based on a voltage difference between the gate terminal and the first terminal. For example, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive a write scan signal GW.

The second transistor T2 may be turned on or off in response to the write scan signal GW. For example, in case that the second transistor T2 is a PMOS transistor, the second transistor T2 may be turned off in case that the write scan signal GW has a positive voltage level, and may be turned on in case that the write scan signal GW has a negative voltage level. The first terminal of the second transistor T2 may receive the data voltage DATA. The second terminal of the second transistor T2 may provide the data voltage DATA to the first terminal of the first transistor T1 while the second transistor T2 is turned on. For example, the second transistor T2 may be referred to as a switching transistor.

The third transistor T3 may include a gate terminal, a first terminal (e.g., a source terminal), and a second terminal (e.g., a drain terminal). The gate terminal of the third transistor T3 may receive a compensation scan signal GC. The first terminal of the third transistor T3 may be connected to the second terminal of the first transistor T1. The second terminal of the third transistor T3 may be connected to the gate terminal of the first transistor T1.

The third transistor T3 may be turned on or off in response to the compensation scan signal GC. For example, in case that the third transistor T3 is an NMOS transistor, the third transistor T3 may be turned on in case that the compensation scan signal GC has a positive voltage level, and may be turned off in case that the compensation scan signal GC has a negative voltage level. During a period in which the third transistor T3 is turned on in response to the compensation scan signal GC, the third transistor T3 may diode-connect the first transistor T1. The third transistor T3 may compensate for a threshold voltage of the first transistor T1. For example, the third transistor T3 may be referred to as a compensation transistor.

The fourth transistor T4 may include a gate terminal, a first terminal (e.g., a source terminal), and a second terminal (e.g., a drain terminal). The gate terminal of the fourth transistor T4 may receive an initialization scan signal GI. The first terminal of the fourth transistor T4 may be connected to the gate terminal of the first transistor T1. The second terminal of the fourth transistor T4 may receive a gate initialization voltage VINT.

The fourth transistor T4 may be turned on or off in response to the initialization scan signal GI. For example, in case that the fourth transistor T4 is an NMOS transistor, the fourth transistor T4 may be turned on in case that the initialization scan signal GI has a positive voltage level, and may be turned off in case that the initialization scan signal GI has a negative voltage level.

During a period in which the fourth transistor T4 is turned on in response to the initialization scan signal GI, the gate initialization voltage VINT may be applied to the gate terminal of the first transistor T1. Accordingly, the fourth transistor T4 may initialize the gate terminal of the first transistor T1 to the gate initialization voltage VINT. For example, the fourth transistor T4 may be referred to as a gate initialization transistor.

The fifth transistor T5 may include a gate terminal, a first terminal (e.g., a source terminal), and a second terminal (e.g., a drain terminal). The gate terminal of the fifth transistor T5 may receive a light emitting control signal EM. The first terminal of the fifth transistor T5 may receive the driving voltage ELVDD. The second terminal of the fifth transistor T5 may be connected to the first transistor T1. In case that the fifth transistor T5 is turned on in response to the light emitting control signal EM, the fifth transistor T5 may provide the driving voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the light emitting control signal EM. The first terminal of the sixth transistor T6 may be connected to the first transistor T1. The second terminal of the sixth transistor T6 may be connected to the light emitting element LD. In case that the sixth transistor T6 is turned on in response to the light emitting control signal EM, the sixth transistor T6 may provide the driving current to the light emitting element LD.

The seventh transistor T7 may include a gate terminal, a first terminal (e.g., a source terminal), and a second terminal (e.g., a drain terminal). The gate terminal of the seventh transistor T7 may receive a bypass scan signal GB. The first terminal of the seventh transistor T7 may be connected to the light emitting element LD. The second terminal of the seventh transistor T7 may receive an anode initialization voltage AINT. In case that the seventh transistor T7 is turned on in response to the bypass scan signal GB, the seventh transistor T7 may provide the anode initialization voltage AINT to the light emitting element LD. Accordingly, the seventh transistor T7 may initialize the first terminal of the light emitting element LD to the anode initialization voltage AINT. For example, the seventh transistor T7 may be referred to as an anode initialization transistor.

In an embodiment, each of the first transistor T1, the second transistor T2, the fifth transistor T5, the sixth transistor T6 and the seventh transistor T7 may be a single-gate transistor, and each of the third transistor T3 and the fourth transistor T4 may be a double-gate transistor. The gate terminal of each of the third transistor T3 and the fourth transistor T4 may include a lower gate terminal and an upper gate terminal, and the lower gate terminal and the upper gate terminal may be electrically connected to each other.

In an embodiment, each of the first transistor T1, the second transistor T2, the fifth transistor T5, the sixth transistor T6 and the seventh transistor T7 may be a PMOS transistor, and each of the third transistor T3 and the fourth transistor T4 may be an NMOS transistor. Accordingly, an active pattern of each of the first transistor T1, the second transistor T2, the fifth transistor T5, the sixth transistor T6 and the seventh transistor T7 may include a silicon semi-conductor doped with cations, and an active pattern of each of the third transistor T3 and the fourth transistor T4 may include an oxide semiconductor.

The write scan signal GW, the light emitting control signal EM and the bypass scan signal GB for turning on each of the second transistor T2, the fifth transistor T5, the sixth transistor T6 and the seventh transistor T7 may have nega-tive voltage levels, and the compensation scan signal GC and the initialization scan signal GI for turning on each of the third transistor T3 and fourth transistor T4 may have positive voltage levels.

The storage capacitor CST may include the first terminal and a second terminal. The first terminal of the storage capacitor CST may be connected to a first transistor T1, and the second terminal of the storage capacitor CST may receive the driving voltage ELVDD. The storage capacitor CST may maintain a voltage level of the gate terminal of the first transistor T1 even in case that the second transistor T2 is turned off. In an embodiment, the storage capacitor CST may include a first storage capacitor CST1, a second storage capacitor CST2 and a third storage capacitor CST3. For example, the first, second and third storage capacitors CST1, CST2 and CST3 may be connected in parallel with each other.

In FIG. 2, it has been described that the pixel circuit PC includes 7 transistors and 1 capacitor, but the disclosure is not limited thereto. For example, the pixel circuit PC may include one to six or eight or more transistors or two or more capacitors.

FIGS. 3, 4, 5, 6, 7, 8, 9, 10, 11 and 12 are schematic views of the display device of FIG. 1. For example, FIGS. 3, 4, 5, 6, 7, 8, 9 and 11 may be plan views for explaining the layout of the display device 10 of FIG. 1, FIG. 10 may be an enlarged plan view of area A of FIG. 9, and FIG. 12 may be an enlarged plan view of area B of FIG. 11.

Figure 3:
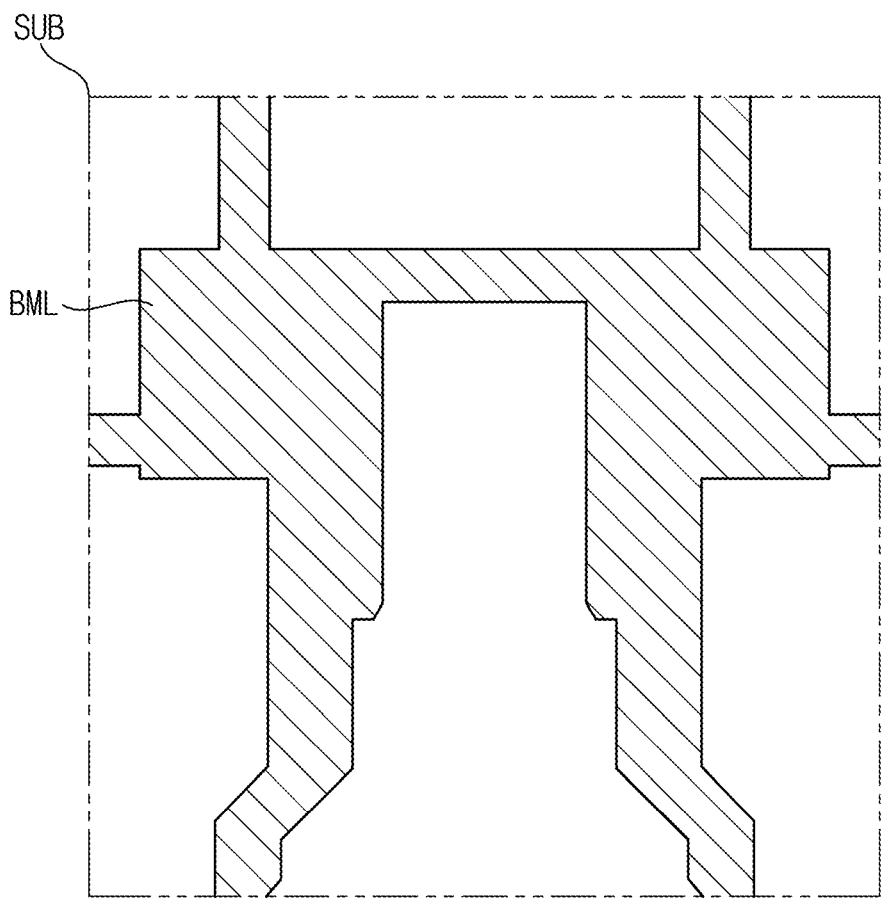
FIGS. 3, 4, 5, 6, 7, 8, 9, 10, 11 and 12 are schematic views of the display device of FIG. 1.
Figure 3:
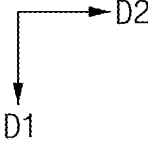

Referring to FIG. 3, the display device 10 may include a substrate SUB and a lower pattern BML.

The substrate SUB may be an insulating substrate includ-ing glass, quartz, plastic, and/or the like. In an embodiment, the substrate SUB may include a first organic layer, a first barrier layer disposed on the first organic layer, a second organic layer disposed on the first barrier layer, and a second barrier layer disposed on the second organic layer.

The first organic layer and the second organic layer may include an organic material. Examples of materials that may be used as the first organic layer and the second organic layer may include polyimide, polyethersulfone, polyacrylate, polyetherimide, polyethylene naphthalate, polyethylene terephthalate, polyphenylene sulfide, polyarylate, polycar-bonate, cellulose acetate propionate, and/or the like.

The first barrier layer and the second barrier layer may include an inorganic insulating material. Examples of mate-rials that may be used as the first barrier layer and the second barrier layer may include silicon oxide ($SiO_x$), silicon nitride ($SiN_x$), silicon oxynitride ($SiO_xN_y$), and/or the like.

The lower pattern BML may be disposed on the substrate SUB. The lower pattern BML may include a conductive material. Examples of materials that may be used as the lower pattern BML may include molybdenum (Mo), copper (Cu), aluminum (Al), titanium (Ti), and/or the like. These may be used alone or in combination with each other.

In an embodiment, a constant voltage may be provided to the lower pattern BML. For example, a driving voltage (e.g., the driving voltage ELVDD of FIG. 2) may be provided to the lower pattern BML. In another embodiment, the lower pattern BML may be electrically floating. In still another embodiment, an AC voltage may be provided to the lower pattern BML.

Figure 4:
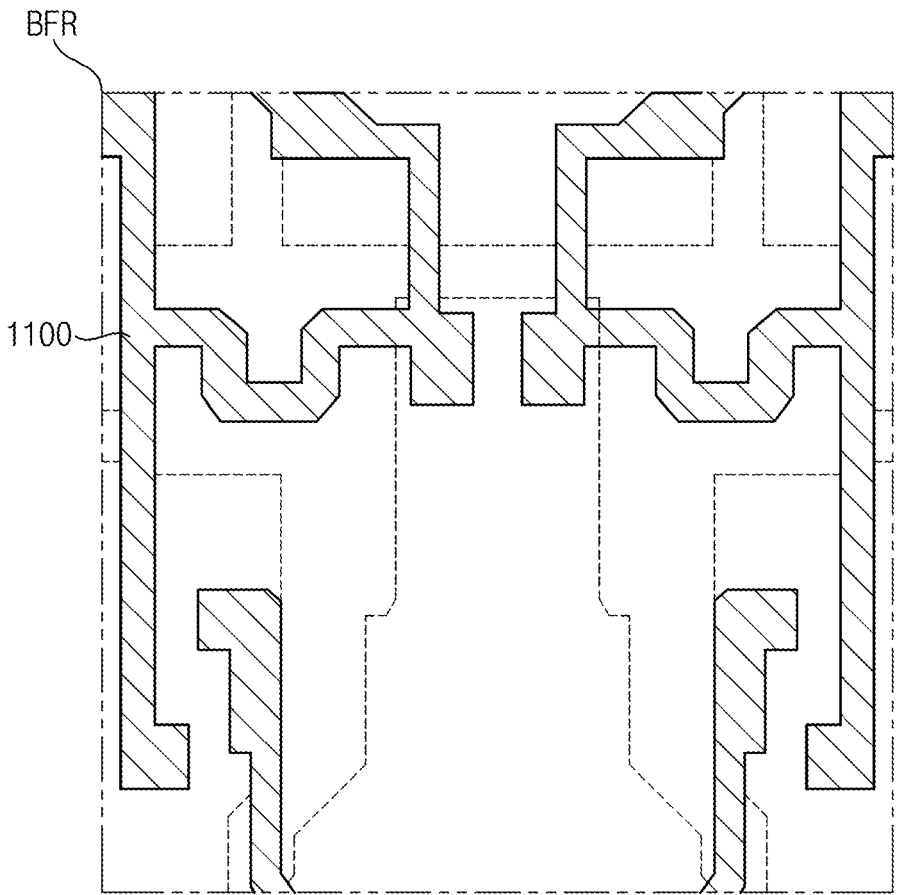
Figure 4:
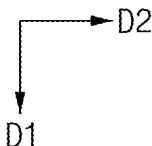

Referring to FIG. 4, a buffer layer BFR may be disposed on the lower pattern BML, and may cover the lower pattern BML.

The buffer layer BFR may prevent metal atoms or impu-rities from diffusing into a first active pattern 1100. The buffer layer BFR may control a heat supply rate during a crystallization process for forming the first active pattern 1100. The buffer layer BFR may include an inorganic insulating material. Examples of inorganic insulating mate-rials that may be used as the buffer layer BFR may include silicon oxide, silicon nitride, silicon oxynitride, and/or the like. These may be used alone or in combination with each other.

The first active pattern 1100 may be disposed on the buffer layer BFR. At least a portion of the first active pattern 1100 may overlap the lower pattern BML in plan view.

In an embodiment, the first active pattern 1100 may include a silicon semiconductor material. Examples of sili-con semiconductor materials that may be used as the first active pattern 1100 may include amorphous silicon, polycrystalline silicon, and/or the like. The first active pattern 1100 may include a source area, a drain area, and a channel area positioned between the source area and the drain area.

Figure 5:
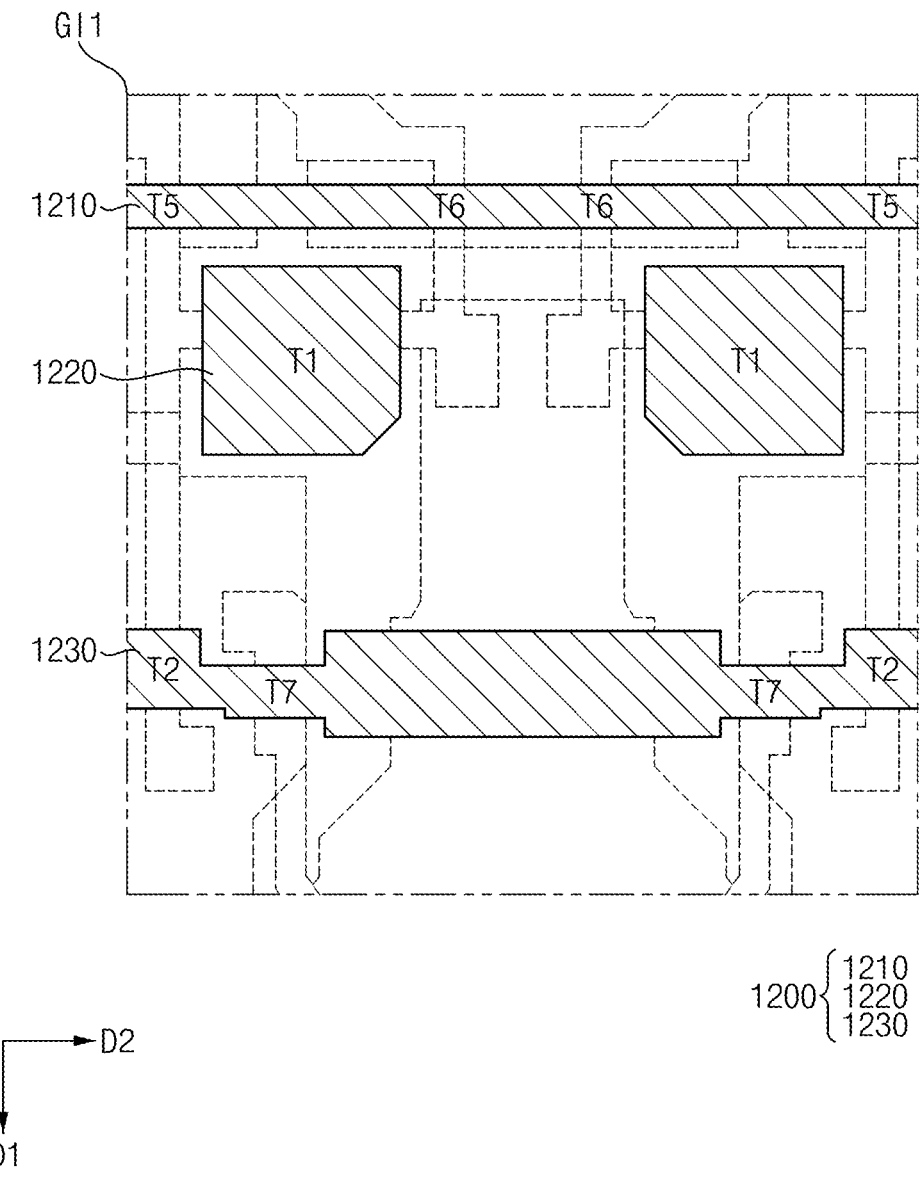

Referring to FIG. 5, a first gate insulating layer GI1 may be disposed on the first active pattern 1100, and may cover the first active pattern 1100.

The first gate insulating layer GI1 may include an inor-ganic insulating material. Examples of inorganic insulating materials that may be used as the first gate insulating layer GI1 may include silicon oxide, silicon nitride, silicon oxyni-tride, and/or the like. These may be used alone or in combination with each other.

A first conductive pattern 1200 may be disposed on the first gate insulating layer GI1 The first conductive pattern 1200 may include a light emitting control line 1210, a gate electrode 1220 and a write scan line 1230.

The light emitting control line 1210 may extend in the second direction D2. In an embodiment, the light emitting control line 1210 may constitute each of the fifth and sixth transistors T5 and T6 together with the first active pattern 1100. For example, the light emitting control line 1210 may correspond to the gate terminals of the fifth and sixth transistors T5 and T6, respectively. A light emitting control signal (e.g., the light emitting control signal EM of FIG. 2) may be provided to the light emitting control line 1210.

The gate electrode 1220 may be spaced apart from the light emitting control line 1210 in the first direction D1. In an embodiment, the gate electrode 1220 may constitute the first transistor T1 together with the first active pattern 1100. For example, the gate electrode 1220 may correspond to the gate terminal of the first transistor T1.

The gate electrode 1220 may overlap the lower pattern BML in plan view. The gate electrode 1220 and the lower pattern BML may form a storage capacitor (e.g., the first storage capacitor CST1 in FIG. 2) in an area where the gate electrode 1220 and the lower pattern BML, overlap.

The write scan line 1230 may extend in the second direction D2, and may be spaced apart from the gate electrode 1220 in the first direction D1. In an embodiment, the write scan line 1230 may constitute each of the second and seventh transistors T2 and T7 together with the first active pattern 1100. For example, the write scan line 1230 may correspond to the gate terminals of the second and seventh transistors T2 and T7, respectively. Each of a write scan signal (e.g., the write scan signal GW of FIG. 2) and a bypass scan signal (e.g., the bypass scan signal GB of FIG. 2) may be provided to the write scan line 1230. For example, the write scan signal and the bypass scan signal may have substantially the same waveform with a time difference therebetween.

The first conductive pattern 1200 may include a conductive material. Examples of materials that may be used as the first conductive pattern 1200 may include molybdenum, copper, aluminum, titanium, and/or the like. These may be used alone or in combination with each other.

Figure 6:
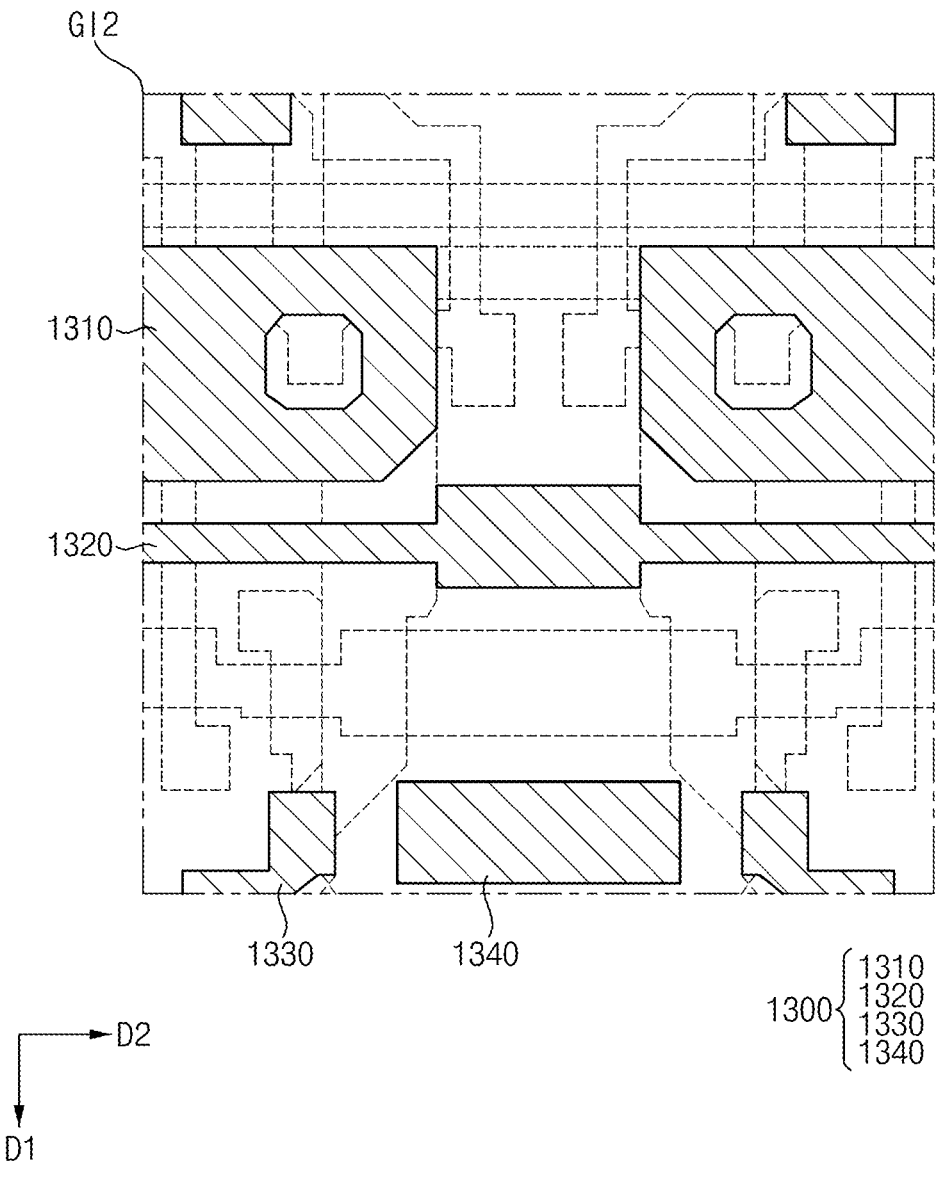

Referring to FIG. 6, a second gate insulating layer GI2 may be disposed on the first conductive pattern 1200, and may cover the first conductive pattern 1200.

The second gate insulating layer GI2 may include an inorganic insulating material. Examples of inorganic insulating materials that may be used as the second gate insulating layer GI2 may include silicon oxide, silicon nitride, silicon oxynitride, and/or the like. These may be used alone or in combination with each other.

In an embodiment, a thickness of the second gate insulating layer GI2 may be about 1200 Å to about 1350 Å. However, the disclosure is not limited thereto.

A second conductive pattern 1300 may be disposed on the second gate insulating layer GI2. The second conductive pattern 1300 may include a capacitor electrode 1310, a first compensation scan line 1320, a blocking electrode 1330 and an initialization scan electrode 1340.

The capacitor electrode 1310 may overlap the gate electrode 1220 in plan view. The capacitor electrode 1310 and the gate electrode 1220 may form a storage capacitor (e.g., the second storage capacitor CST2 in FIG. 2) in an area where the capacitor electrode 1310 and the gate electrode 1220 overlap. In an embodiment, an opening exposing a top surface of the gate electrode 1220 may be formed in the capacitor electrode 1310.

The first compensation scan line 1320 may extend in the second direction D2, and may be spaced apart from the capacitor electrode 1310 in the first direction D1. In an embodiment, the first compensation scan line 1320 may constitute the third transistor T3. For example, the first compensation scan line 1320 may correspond to the lower gate terminal of the third transistor T3. A compensation scan signal (e.g., the compensation scan signal GC of FIG. 2) may be provided to the first compensation scan line 1320.

The blocking electrode 1330 may be spaced apart from the first compensation scan line 1320 in the first direction D1. In an embodiment, the blocking electrode 1330 may overlap the first active pattern 1100 in plan view. The blocking electrode 1330 may improve crosstalk between the first active pattern 1100 and a pixel electrode included in a light emitting element (e.g., the light emitting element LD of FIG. 2).

The initialization scan electrode 1340 may be spaced apart from the first compensation scan line 1320 in the first direction D1. In an embodiment, the initialization scan electrode 1340 may constitute the fourth transistor T4. For example, the initialization scan electrode 1340 may correspond to the lower gate terminal of the fourth transistor T4. An initialization scan signal (e.g., the initialization scan signal GI of FIG. 2) may be provided to the initialization scan electrode 1340.

The second conductive pattern 1300 may include a conductive material. Examples of materials that may be used as the second conductive pattern 1300 may include molybdenum, copper, aluminum, titanium, and/or the like. These may be used alone or in combination with each other.

Figure 7:
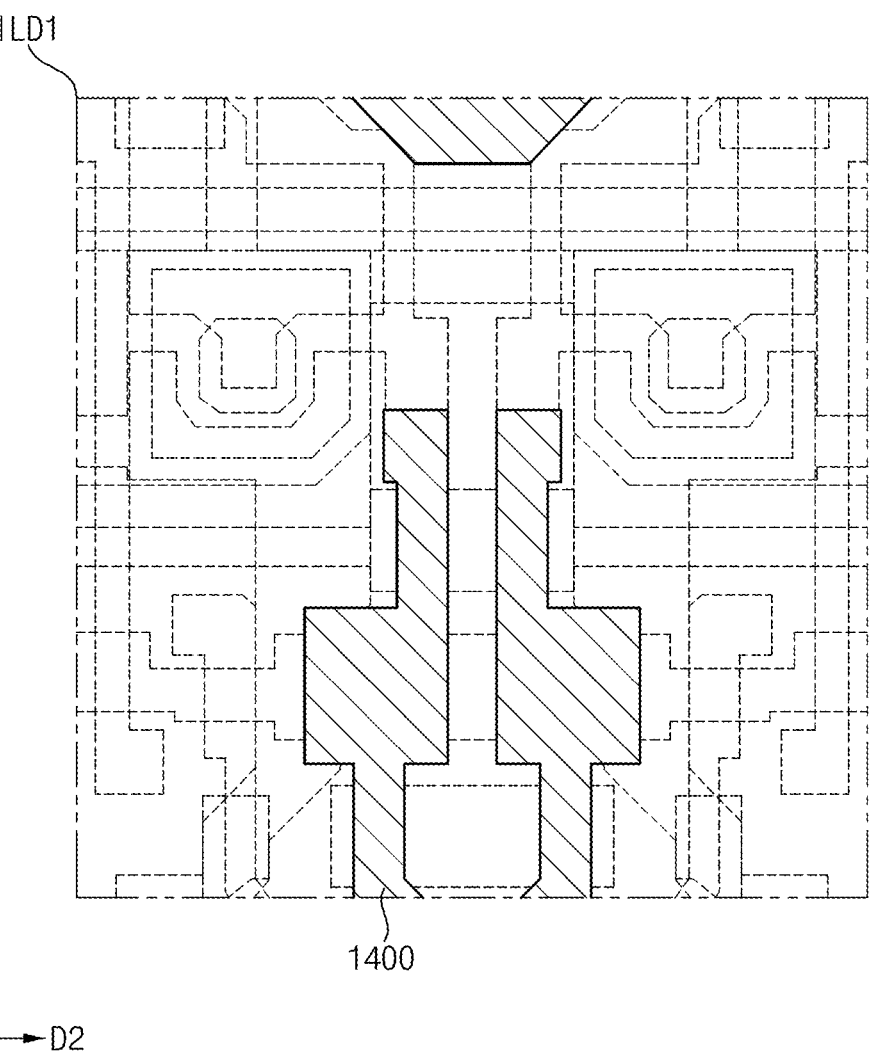

Referring to FIG. 7, a first interlayer insulating layer ILD1 may be disposed on the second conductive pattern 1300, and may cover the second conductive pattern 1300.

The first interlayer insulating layer ILD1 may include an inorganic insulating material. Examples of inorganic insulating materials that may be used as the first interlayer insulating layer ILD1 may include silicon oxide, silicon nitride, silicon oxynitride, and/or the like. These may be used alone or in combination with each other.

A second active pattern 1400 may be disposed on the first interlayer insulating layer ILD1. For example, the second active pattern 1400 may overlap each of the first compensation scan line 1320 and the initialization scan electrode 1340 in plan view.

In an embodiment, the second active pattern 1400 may be disposed on a different layer from the first active pattern 1100, and may not overlap the first active pattern 1100. In other words, the second active pattern 1400 may be formed separately from the first active pattern 1100.

In an embodiment, the first active pattern 1100 and the second active pattern 1400 may include different materials. For example, the first active pattern 1100 may include a silicon semiconductor material, and the second active pattern 1400 may include an oxide semiconductor material. Examples of oxide semiconductor materials that may be used as the second active pattern 1400 may include indium gallium zinc oxide (IGZO), indium tin zinc oxide (ITZO), and/or the like. The second active pattern 1400 may include a source area, a drain area, and a channel area positioned between the source area and the drain area.

Figure 8:
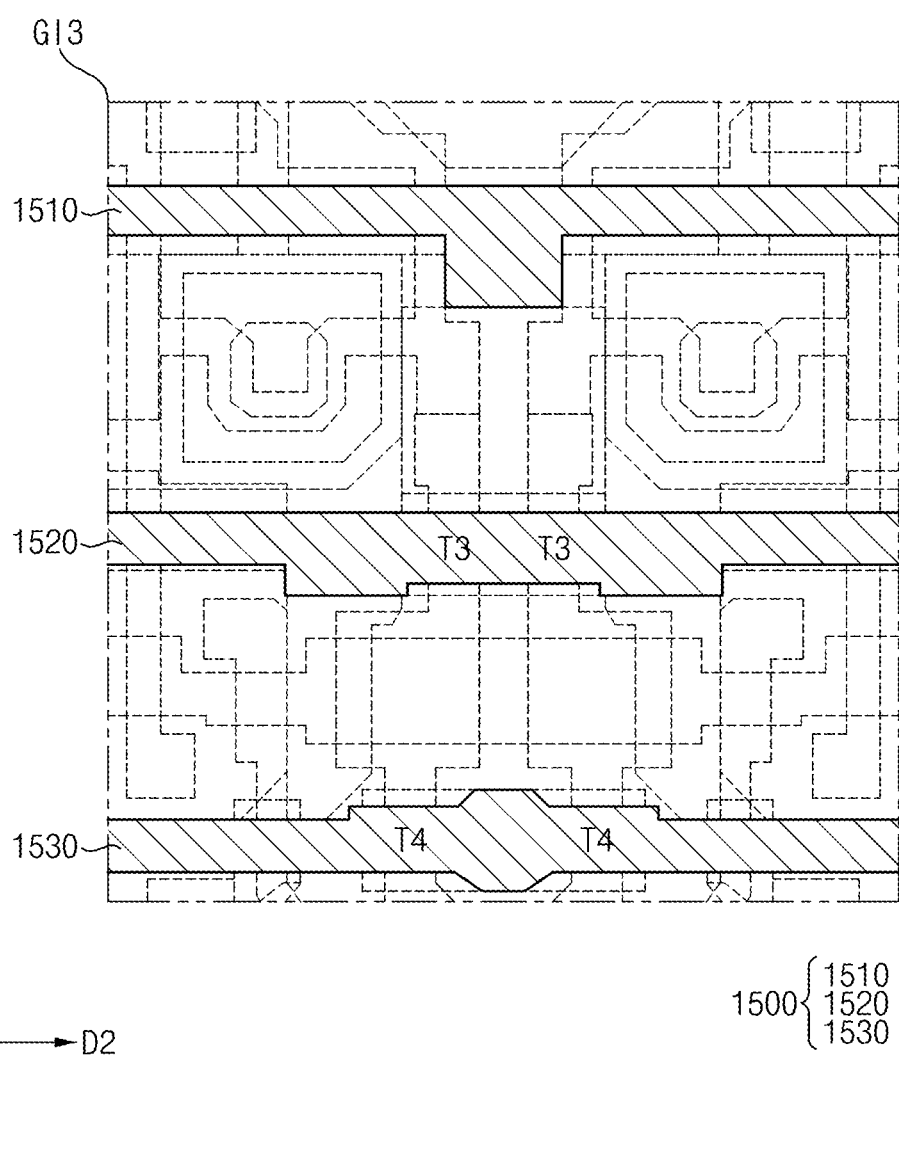

Referring to FIG. 8, a third gate insulating layer GI3 may be disposed on the second active pattern 1400, and may cover the second active pattern 1400.

The third gate insulating layer GI3 may include an inorganic insulating material. Examples of inorganic insulating materials that may be used as the third gate insulating layer GI3 may include silicon oxide, silicon nitride, silicon oxynitride, and/or the like. These may be used alone or in combination with each other.

A third conductive pattern 1500 may be disposed on the third gate insulating layer GI3. The third conductive pattern 1500 may include a first initialization voltage line 1510, a second compensation scan line 1520 and an initialization scan line 1530.

The first initialization voltage line 1510 may extend in the second direction D2. In an embodiment, the first initialization voltage line 1510 may provide a gate initialization voltage (e.g., the gate initialization voltage VINT of FIG. 2) to the fourth transistor T4. For example, the first initialization voltage line 1510 may be electrically connected to the second active pattern 1400.

The second compensation scan line 1520 may extend in the second direction D2, and may be spaced apart from the first initialization voltage line 1510 in the first direction D1. The second compensation scan line 1520 may overlap the first compensation scan line 1320, and may be electrically connected to the first compensation scan line 1320. In an embodiment, the second compensation scan line 1520 may constitute the third transistor T3 together with the second active pattern 1400. For example, the second compensation scan line 1520 may correspond to the upper gate terminal of the third transistor T3. The compensation scan signal may be provided to the second compensation scan line 1520.

The initialization scan line 1530 may extend in the second direction D2, and may be spaced apart from the second compensation scan line 1520 in the first direction D1. The initialization scan line 1530 may overlap the initialization scan electrode 1340, and may be electrically connected to the initialization scan electrode 1340. In an embodiment, the initialization scan line 1530 may constitute the fourth transistor T4 together with the second active pattern 1400. For example, the initialization scan line 1530 may correspond to the upper gate terminal of the fourth transistor T4. The initialization scan signal may be provided to the initialization scan line 1530.

The third conductive pattern 1500 may include a conductive material. Examples of materials that may be used as the third conductive pattern 1500 may include molybdenum, copper, aluminum, titanium, and/or the like. These may be used alone or in combination with each other.

Figure 9:
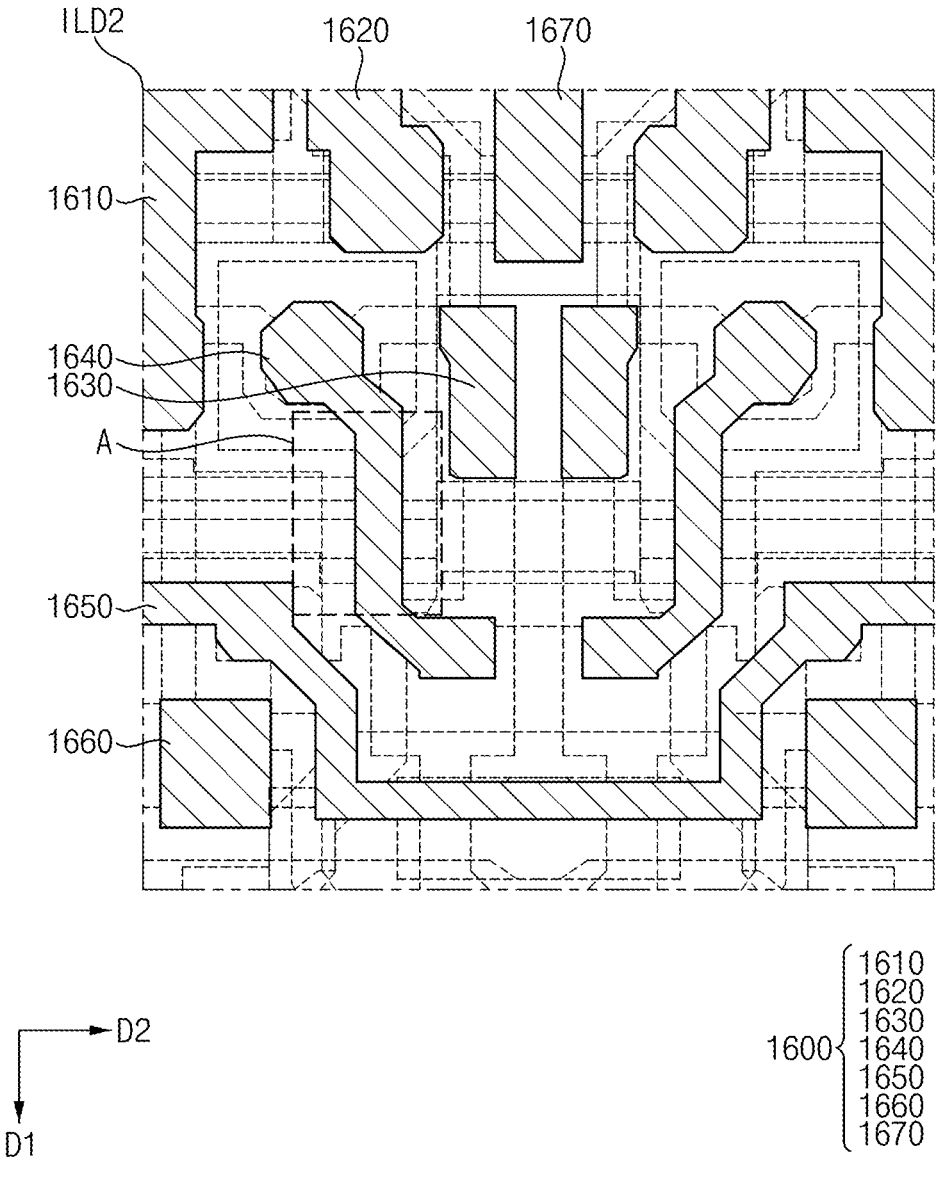
Figure 10:
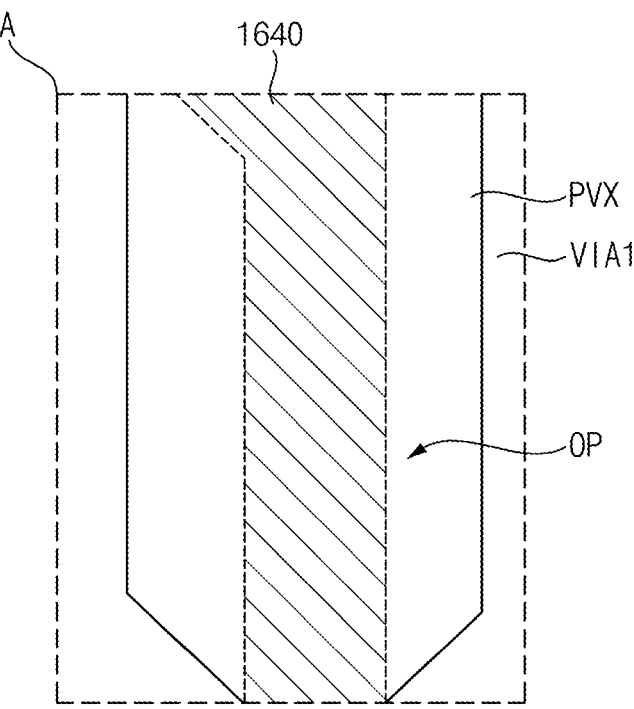
Figure 10:
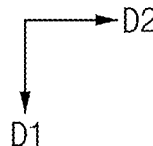

Referring to FIGS. 9 and 10, a second interlayer insulating layer ILD2 may be disposed on the third conductive pattern 1500, and may cover the third conductive pattern 1500.

In an embodiment, the second interlayer insulating layer ILD2 may include an inorganic insulating material. Examples of inorganic insulating materials that may be used as the second interlayer insulating layer ILD2 may include silicon oxide, silicon nitride, silicon oxynitride, and/or the like. These may be used alone or in combination with each other.

A fourth conductive pattern 1600 may be disposed on the second interlayer insulating layer ILD2. The fourth conductive pattern 1600 may include a driving voltage connection electrode 1610, a first light emitting element connection electrode 1620, an active connection electrode 1630, a gate connection electrode 1640, a second initialization voltage line 1650, a first data connection electrode 1660 and an initialization voltage connection electrode 1670.

The driving voltage connection electrode 1610 may transmit the driving voltage to the first active pattern 1100. In an embodiment, the driving voltage connection electrode 1610 may electrically connect a driving voltage line (e.g., a driving voltage line 1720 of FIG. 11) and the first active pattern 1100. For example, the driving voltage connection electrode 1610 may contact the driving voltage line and the first active pattern 1100.

The first light emitting element connection electrode 1620 may be spaced apart from the driving voltage connection electrode 1610. The first light emitting element connection electrode 1620 may provide an anode initialization voltage (e.g., the anode initialization voltage AINT of FIG. 2) or the driving current to a light emitting element (e.g., the light emitting element LD of FIG. 2). For example, the first light emitting element connection electrode 1620 may contact the first active pattern 1100 and a second light emitting element connection electrode (e.g., a second light emitting element connection electrode 1730 of FIG. 11).

The active connection electrode 1630 may be spaced apart from the first light emitting element connection electrode 1620. The active connection electrode 1630 may electrically connect the first transistor T1 and the third transistor T3. For example, the active connection electrode 1630 may contact the first active pattern 1100 and the second active pattern 1400.

The gate connection electrode 1640 may be spaced apart from the active connection electrode 1630. In an embodiment, the gate connection electrode 1640 may extend in the first direction D1. For example, the gate connection electrode 1640 may cross each of the first compensation scan line 1320 and the second compensation scan line 1520 in plan view. The gate connection electrode 1640 may overlap each of the gate electrode 1220 and the capacitor electrode 1310 in plan view. The gate connection electrode 1640 may electrically connect the first transistor T1 and the fourth transistor T4. For example, the gate connection electrode 1640 may contact the gate electrode 1220 and the second active pattern 1400.

The second initialization voltage line 1650 may extend in the second direction D2, and may be spaced apart from the gate connection electrode 1640. The second initialization voltage line 1650 may provide the anode initialization voltage to the seventh transistor T7. For example, the second initialization voltage line 1650 may contact the first active pattern 1100.

The first data connection electrode 1660 may be spaced apart from the second initialization voltage line 1650. The first data connection electrode 1660 may provide a data voltage (e.g., the data voltage DATA of FIG. 2) to the second transistor T2. For example, the first data connection electrode 1660 may contact the first active pattern 1100 and a second data connection electrode (e.g., a second data connection electrode 1710 of FIG. 12).

The initialization voltage connection electrode 1670 may be spaced apart from the first data connection electrode 1660. The initialization voltage connection electrode 1670 may provide the gate initialization voltage to the fourth transistor T4. For example, the initialization voltage connection electrode 1670 may provide the gate initialization voltage to the second active pattern 1400. The initialization voltage connection electrode 1670 may contact the first initialization voltage line 1510 and the second active pattern 1400.

The fourth conductive pattern 1600 may contact a conductive pattern or an active pattern disposed below the fourth conductive pattern 1600 through contact holes.

The fourth conductive pattern 1600 may include a conductive material. Examples of materials that may be used as the fourth conductive pattern 1600 may include molybdenum, copper, aluminum, titanium, and/or the like. These may be used alone or in combination with each other.

A passivation layer PVX may be disposed on the fourth conductive pattern 1600, and may cover the fourth conductive pattern 1600. The passivation layer PVX may include an inorganic insulating material and/or an organic insulating material. Examples of inorganic insulating materials that may be used as the passivation layer PVX may include silicon oxide, silicon nitride, silicon oxynitride, and/or the like. Examples of organic insulating materials that may be used as the passivation layer PVX may include photoresist, polyacrylic resin, polyimide resin, acrylic resin, and/or the like. These may be used alone or in combination with each other.

A first via insulating layer VIA1 may be disposed on the passivation layer PVX. In an embodiment, an opening OP exposing at least a portion of the gate connection electrode 1640 may be defined in the first via insulating layer VIA1 More specifically, the opening OP exposing the passivation layer PVX overlapping at least a portion of the gate connection electrode 1640 may be defined in the first via insulating layer VIA1.

In an embodiment, the opening OP may extend in the first direction D1. For example, the opening OP may extend along the first direction D1, and may expose the gate connection electrode 1640. For example, the opening OP may cross each of the first compensation scan line 1320 and the second compensation scan line 1520 in plan view.

The first via insulating layer VIA1 may include an organic insulating material. Examples of organic insulating materials that may be used as the first via insulating layer VIA1 may include photoresist, polyacrylic resin, polyimide resin, acrylic resin, and/or the like. These may be used alone or in combination with each other.

Figure 11:
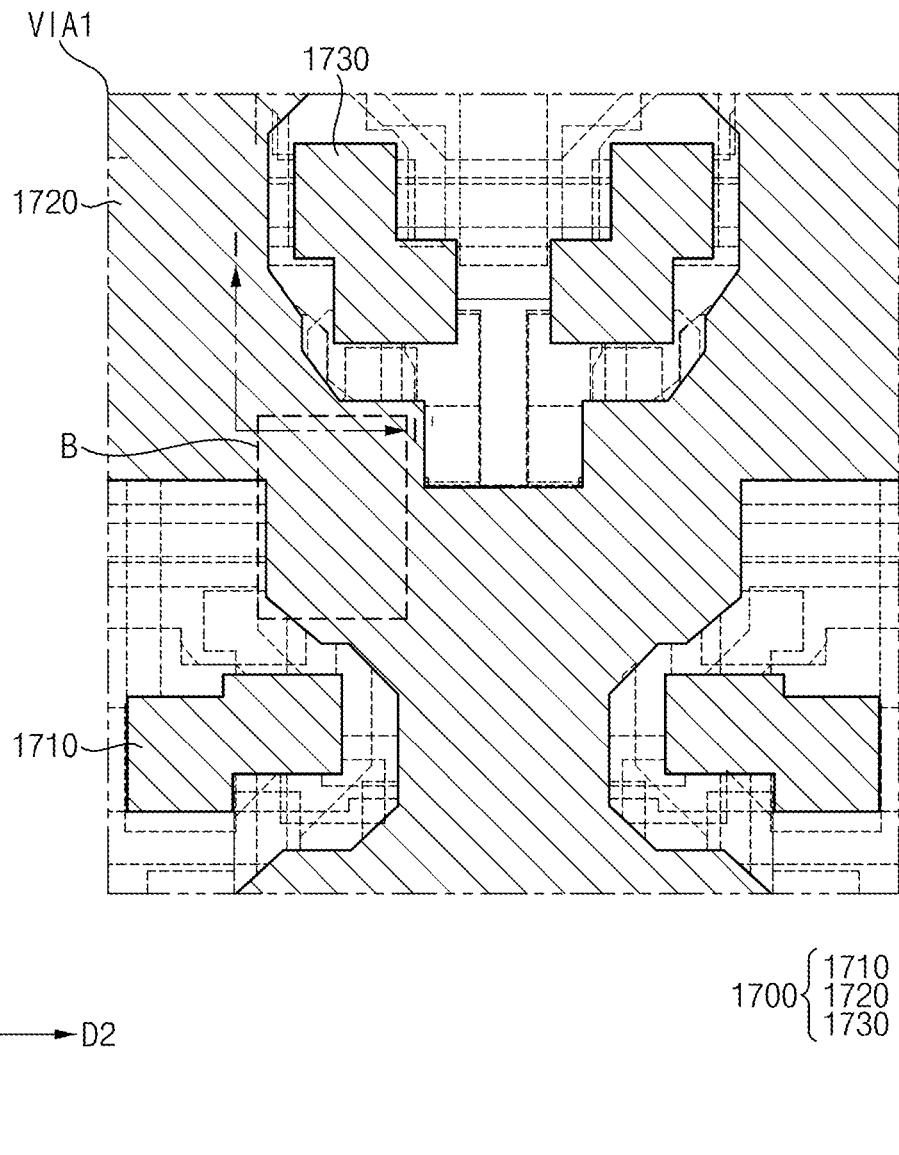
Figure 12:
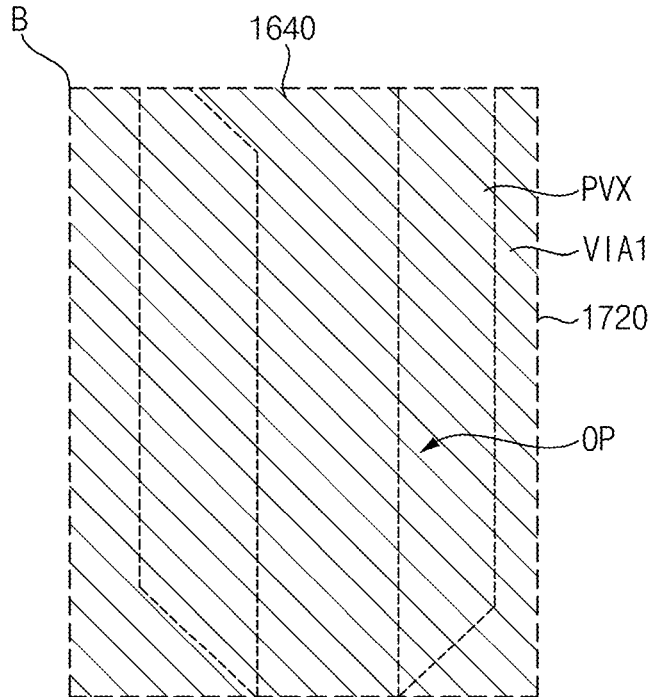
Figure 12:
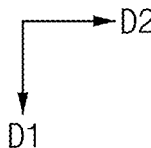

Referring to FIGS. 11 and 12, a fifth conductive pattern 1700 may be disposed on the first via insulating layer VIA1. The fifth conductive pattern 1700 may include a second data connection electrode 1710, a driving voltage line 1720 and a second light emitting element connection electrode 1730.

The second data connection electrode 1710 may provide the data voltage to the second transistor T2. For example, the second data connection electrode 1710 may contact the first data connection electrode 1660.

The driving voltage line 1720 may extend in the first direction D1 and the second direction D2, and may be spaced apart from the second data connection electrode 1710. In an embodiment, the driving voltage line 1720 may provide the driving voltage to the driving voltage connection electrode 1610. For example, the driving voltage line 1720 may contact the driving voltage connection electrode 1610.

In an embodiment, the driving voltage line 1720 may entirely cover the opening OP of the first via insulating layer VIA1. For example, the driving voltage line 1720 may contact the passivation layer PVX in the opening OP, and may overlap the gate connection electrode 1640.

In an embodiment, the driving voltage line 1720 and the gate connection electrode 1640 may additionally form a storage capacitor (e.g., the third storage capacitor CST3 in FIG. 2) in an area where the driving voltage line 1720 and the gate connection electrode 1640 overlap. In other words, the driving voltage line 1720 and the gate connection electrode 1640 may additionally form the storage capacitor in the opening OP.

The second light emitting element connection electrode 1730 may be spaced apart from the driving voltage line 1720. The second light emitting element connection electrode 1730 may provide the anode initialization voltage or the driving current to the light emitting element. For example, the second light emitting element connection electrode 1730 may contact the first light emitting element connection electrode 1620.

Figure 13:
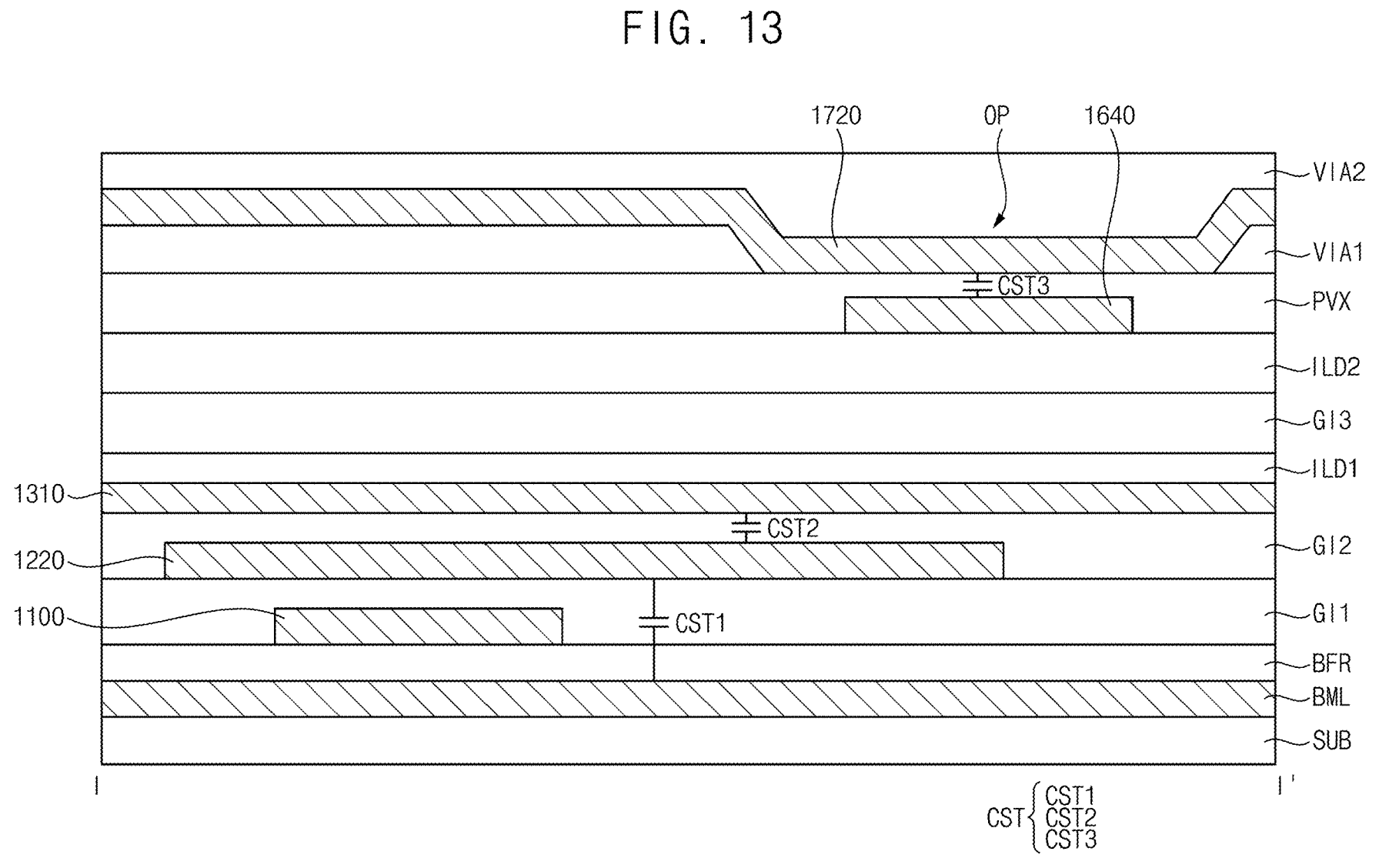

FIG. 13 is a schematic cross-sectional view taken along line I-I' of FIG. 11.

Referring to FIG. 13, the display device 10 may include the substrate SUB, the lower pattern BML, the buffer layer BFR, the first active pattern 1100, the first gate insulating layer GI1, the gate electrode 1220, the second gate insulating layer GI2, the capacitor electrode 1310, the first interlayer insulating layer ILD1, the third gate insulating layer GI3, the second interlayer insulating layer ILD2, the gate connection electrode 1640, the passivation layer PVX, the first via insulating layer VIA1, the driving voltage line 1720 and a second via insulating layer VIA2. Hereinafter, redundant descriptions are omitted or simplified.

The lower pattern BML, the buffer layer BFR, the first active pattern 1100, the first gate insulating layer GI1, the gate electrode 1220, the second gate insulating layer GI2, the capacitor electrode 1310, the first interlayer insulating layer ILD1, the third gate insulating layer GI3, the second interlayer insulating layer ILD2, the gate connection electrode 1640, the passivation layer PVX, the first via insulating layer VIA1, the driving voltage line 1720 and the second via insulating layer VIA2 may be sequentially disposed on the substrate SUB.

The lower pattern BML and the gate electrode 1220 may overlap, and the first storage capacitor CST1 may be formed in an area where the lower pattern BML and the gate electrode 1220 overlap.

The gate electrode 1220 and the capacitor electrode 1310 may overlap, and the second storage capacitor CST2 may be formed in an area where the gate electrode 1220 and the capacitor electrode 1310 overlap.

The opening OP exposing at least a portion of the passivation layer PVX may be defined in the first via insulating layer VIAL More specifically, the opening OP exposing the passivation layer PVX overlapping the gate connection electrode 1640 may be defined in the first via insulating layer VIA1.

The driving voltage line 1720 may be disposed on the first via insulating layer VIA1 and the passivation layer PVX exposed by the opening OP. For example, the driving voltage line 1720 may entirely cover the opening OP. In an embodiment, the driving voltage line 1720 and the gate connection electrode 1640 may overlap with the passivation layer PVX interposed therebetween in the opening OP, and the third storage capacitor CST3 may be formed in an area the driving voltage line 1720 and the gate connection electrode 1640 overlap.

The second via insulating layer VIA2 may be disposed on the driving voltage line 1720. The second via insulating layer VIA2 may include an organic insulating material. Examples of organic insulating materials that may be used as the second via insulating layer VIA2 may include photoresist, polyacrylic resin, polyimide resin, acrylic resin, and/or the like. These may be used alone or in combination with each other.

The display device 10 according to an embodiment of the disclosure may include the fourth conductive pattern 1600 including the gate connection electrode 1640, the passivation layer PVX, the first via insulating layer VIA1 and the fifth conductive pattern 1700 including the driving voltage line 1720. As the opening OP exposing the passivation layer PVX overlapping the gate connection electrode 1640 is defined in the first via insulating layer VIA1, the gate connection electrode 1640 and the driving voltage line 1720 may overlap with the passivation layer PVX interposed therebetween in the opening OP. Since the gate connection electrode 1640 and the driving voltage line 1720 additionally form the third storage capacitor CST3, a capacity of the storage capacitor CST of the first transistor T1 may be sufficiently secured. Accordingly, a voltage of the first transistor T1 may be stabilized, and display quality of the display device 10 may be improved.

FIGS. 14, 15, 16, 17, 18 and 19 are schematic views of a display device according to another embodiment. For example, FIG. 17 may be an enlarged plan view of area C of FIG. 16, and FIG. 19 may be an enlarged plan view of area D of FIG. 18.

Hereinafter, descriptions overlapping those of the display device 10 described with reference to FIGS. 3, 4, 5, 6, 7, 8, 9, 10, 11 and 12 will be omitted or simplified.

Figure 14:
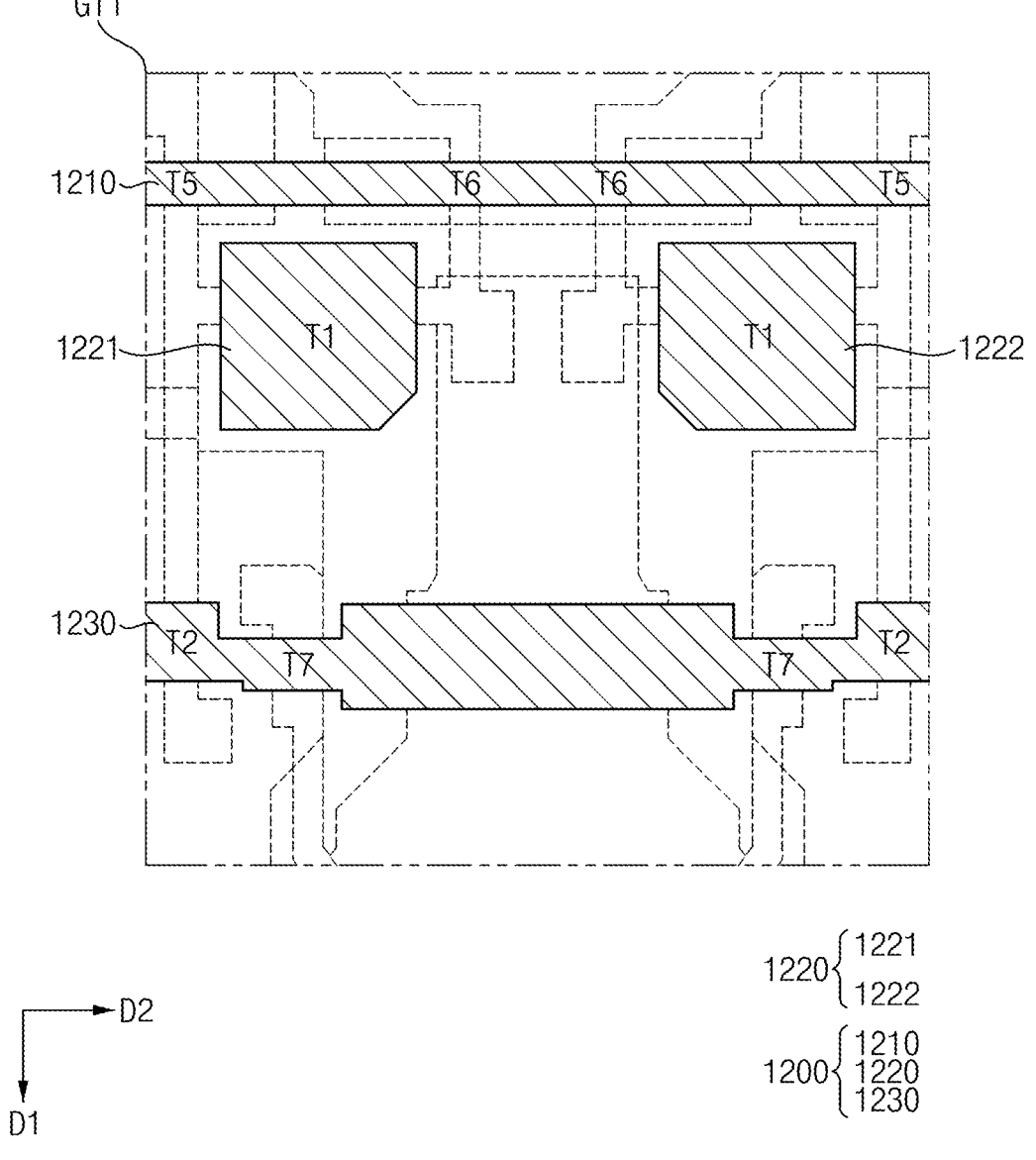
FIGS. 14, 15, 16, 17, 18 and 19 are schematic views of a display device according to another embodiment.

Referring to FIG. 14, the first conductive pattern 1200 may be disposed on the first gate insulating layer GI1. The first conductive pattern 1200 may include the light emitting control line 1210, the gate electrode 1220 and the write scan line 1230.

The gate electrode 1220 may include a first gate electrode 1221 and a second gate electrode 1222. The second gate electrode 1222 may be spaced apart from the first gate electrode 1221 in the second direction D2.

Figure 15:
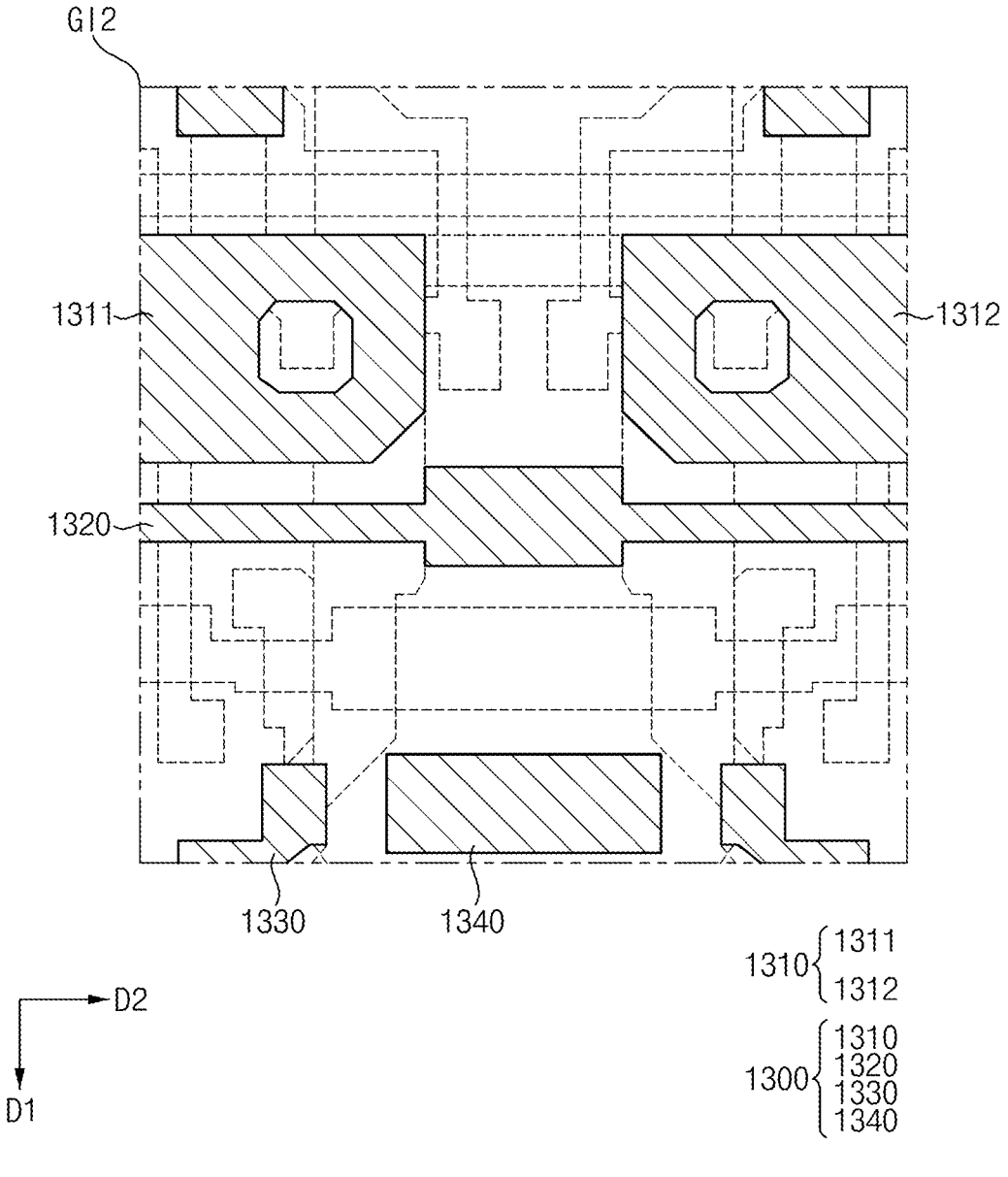

Referring to FIG. 15, the second conductive pattern 1300 may be disposed on the second gate insulating layer GI2. The second conductive pattern 1300 may include the capacitor electrode 1310, the first compensation scan line 1320, the blocking electrode 1330 and the initialization scan electrode 1340.

The capacitor electrode 1310 may include a first capacitor electrode 1311 and a second capacitor electrode 1312. The second capacitor electrode 1312 may be spaced apart from the first capacitor electrode 1311 in the second direction D2. The first capacitor electrode 1311 may overlap the first gate electrode 1221 in plan view, and the second capacitor electrode 1312 may overlap the second gate electrode 1222 in plan view.

Figure 16:
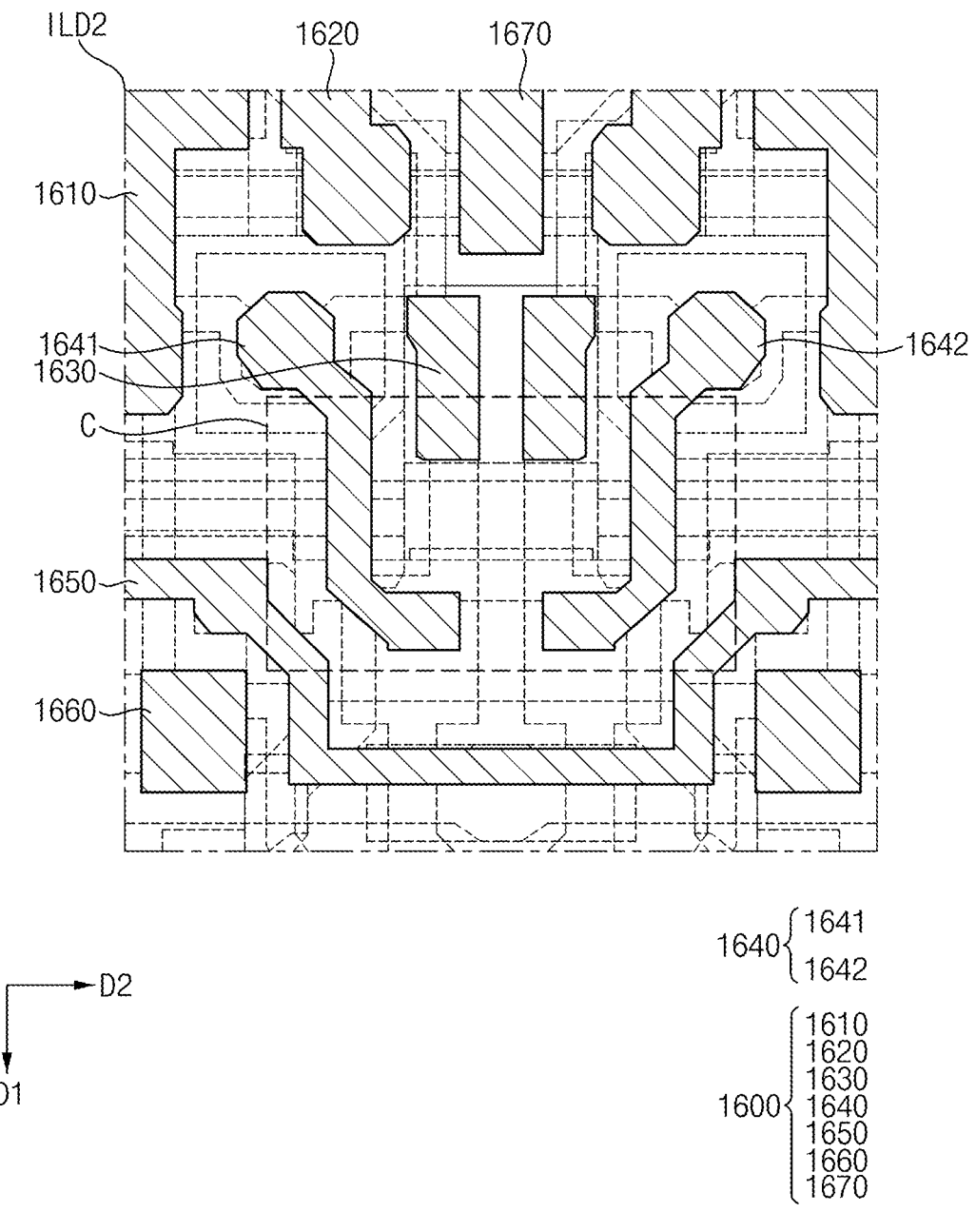
Figure 17:
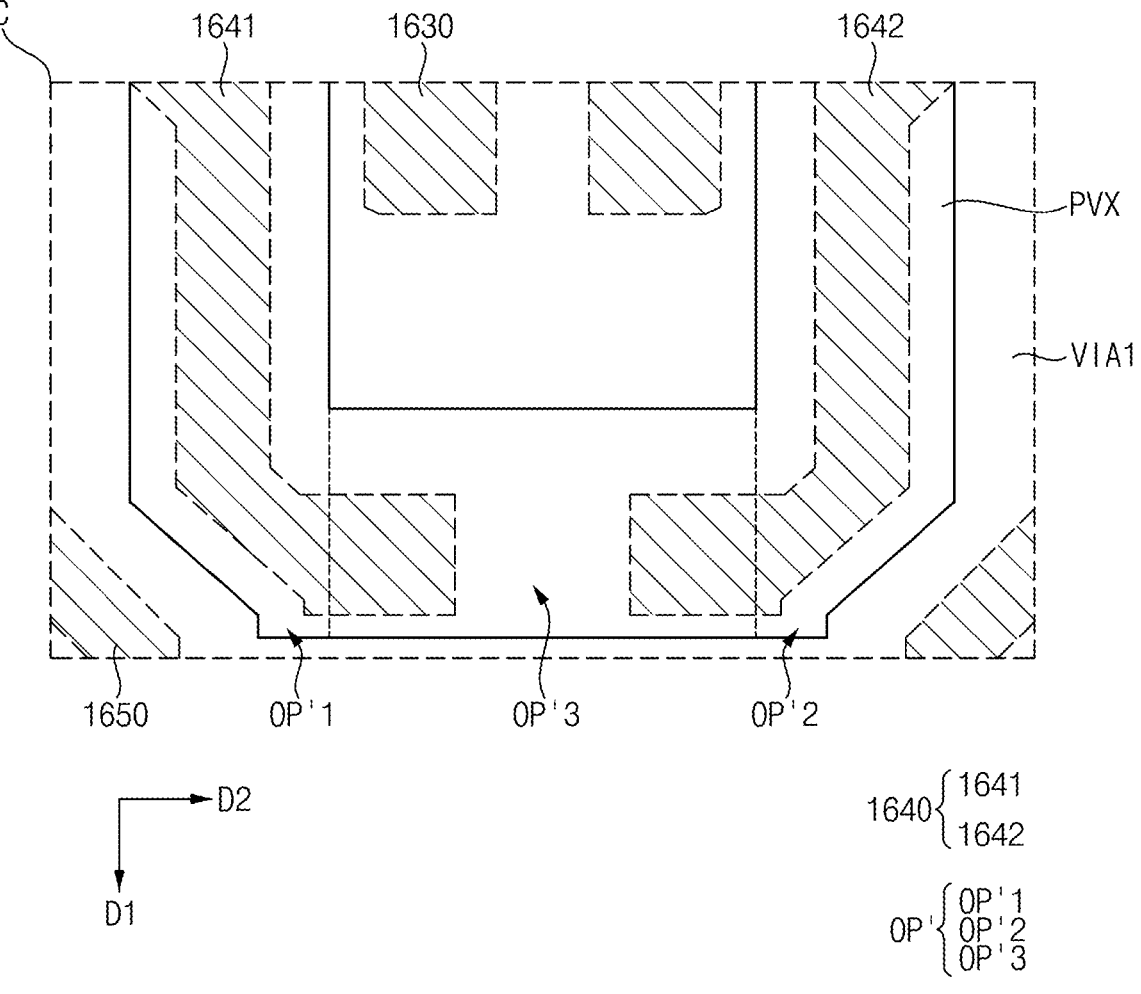

Referring to FIGS. 16 and 17, the fourth conductive pattern 1600 may be disposed on the second interlayer insulating layer ILD2. The fourth conductive pattern 1600 may include the driving voltage connection electrode 1610, the first light emitting element connection electrode 1620, the active connection electrode 1630, the gate connection electrode 1640, the second initialization voltage line 1650, the first data connection electrode 1660 and the initialization voltage connection electrode 1670.

The gate connection electrode 1640 may include a first gate connection electrode 1641 and a second gate connection electrode 1642. The second gate connection electrode 1642 may be spaced apart from the first gate connection electrode 1641 in the second direction D2.

In an embodiment, each of the first gate connection electrode 1641 and the second gate connection electrode 1642 may extend in the first direction D1. For example, each of the first gate connection electrode 1641 and the second gate connection electrode 1642 may cross the first compensation scan line 1320 and the second compensation scan line 1520 in plan view. The first gate connection electrode 1641 may overlap each of the first gate electrode 1221 and the first capacitor electrode 1311 in plan view, and the second gate connection electrode 1642 may overlap each of the second gate electrode 1222 and the second capacitor electrode 1312 in plan view.

The passivation layer PVX may be disposed on the fourth conductive pattern 1600, and the first via insulating layer VIA1 may be disposed on the passivation layer PVX.

In an embodiment, a U-shaped opening OP' exposing at least a portion of each of the first gate connection electrode 1641 and the second gate connection electrode 1642 may be defined in the first via insulating layer VIA1 More specifically, the opening OP' may have a U-shape in which a lower flat surface is cut off in plan view. For example, in the first via insulating layer VIA1, the opening OP' exposing the passivation layer PVX overlapping at least a portion of each of the first gate connection electrode 1641 and the second gate connection electrode 1642 and having the U-shape in which the lower flat surface is cut off in plan view may be defined.

In an embodiment, the opening OP' may include a first opening OP'1 extending in the first direction D1, a second opening OP'2 extending in the first direction D1 and a third opening OP'3 extending in the direction D2. For example, the first opening OP'1 may expose at least a portion of the first gate connection electrode 1641, the second opening OP'2 may expose at least a portion of the second gate connection electrode 1642, and the third opening OP'3 may expose at least a portion of each of the first gate connection electrode 1641 and the second gate connection electrode 1642. For example, the first opening OP'1 may extend along the first direction D1, and may expose the first gate connection electrode 1641. The second opening OP'2 may extend along the first direction D1, and may expose the second gate connection electrode 1642. The third opening OP'3 may extend along the second direction D2, and may expose the first gate connection electrode 1641 and the second gate connection electrode 1642.

More specifically, the second opening OP'2 may be spaced apart from the first opening OP'1 in the second direction D2, and the third opening OP'3 may connect the first opening OP'1 and the second opening OP'2. In other words, the opening OP' may extend from the first opening OP'1 to the second opening OP'2 along the third opening OP'3.

In an embodiment, the opening OP' may overlap each of the first compensation scan line 1320 and the second compensation scan line (e.g., the second compensation scan line 1520 of FIG. 8) in plan view. More specifically, each of the first opening OP'1 and the second opening OP'2 may cross the first compensation scan line 1320 and the second compensation scan line in plan view.

Figure 18:
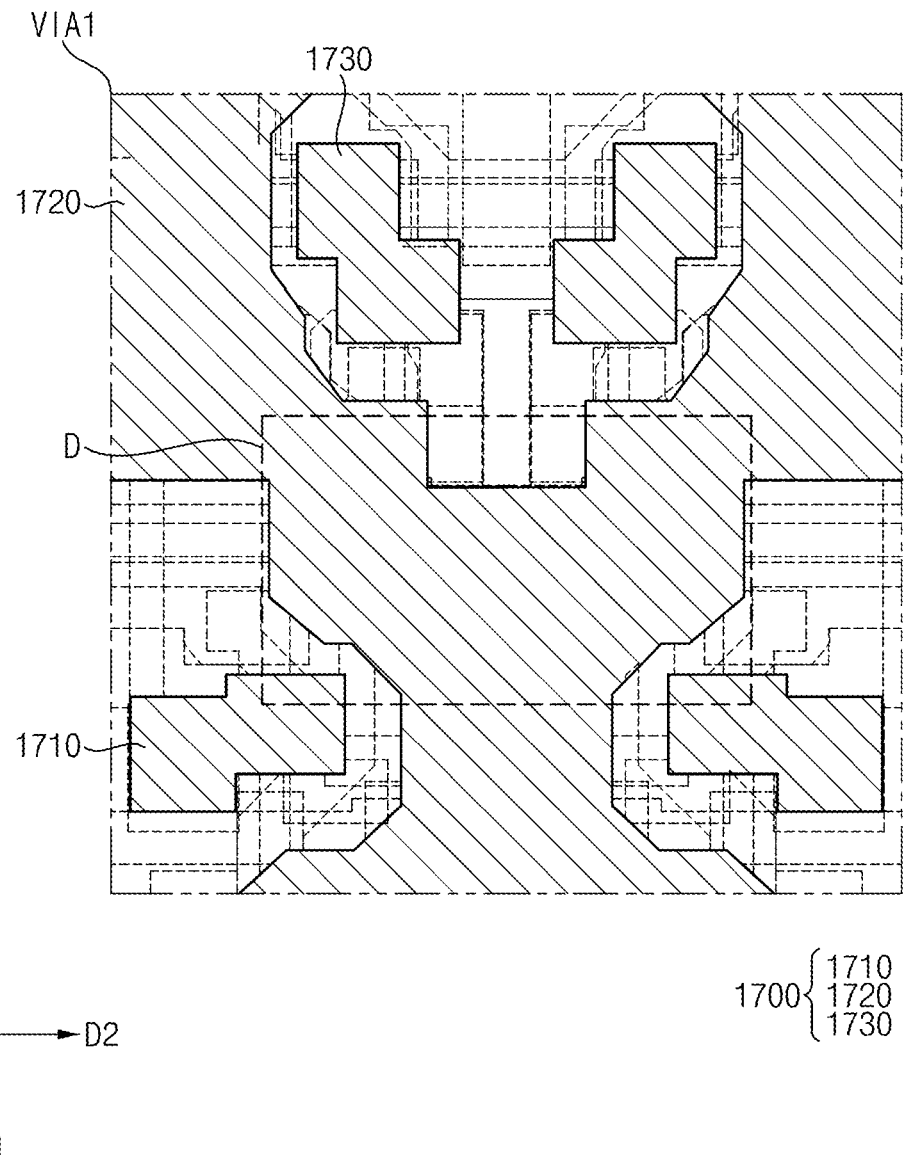
Figure 19:
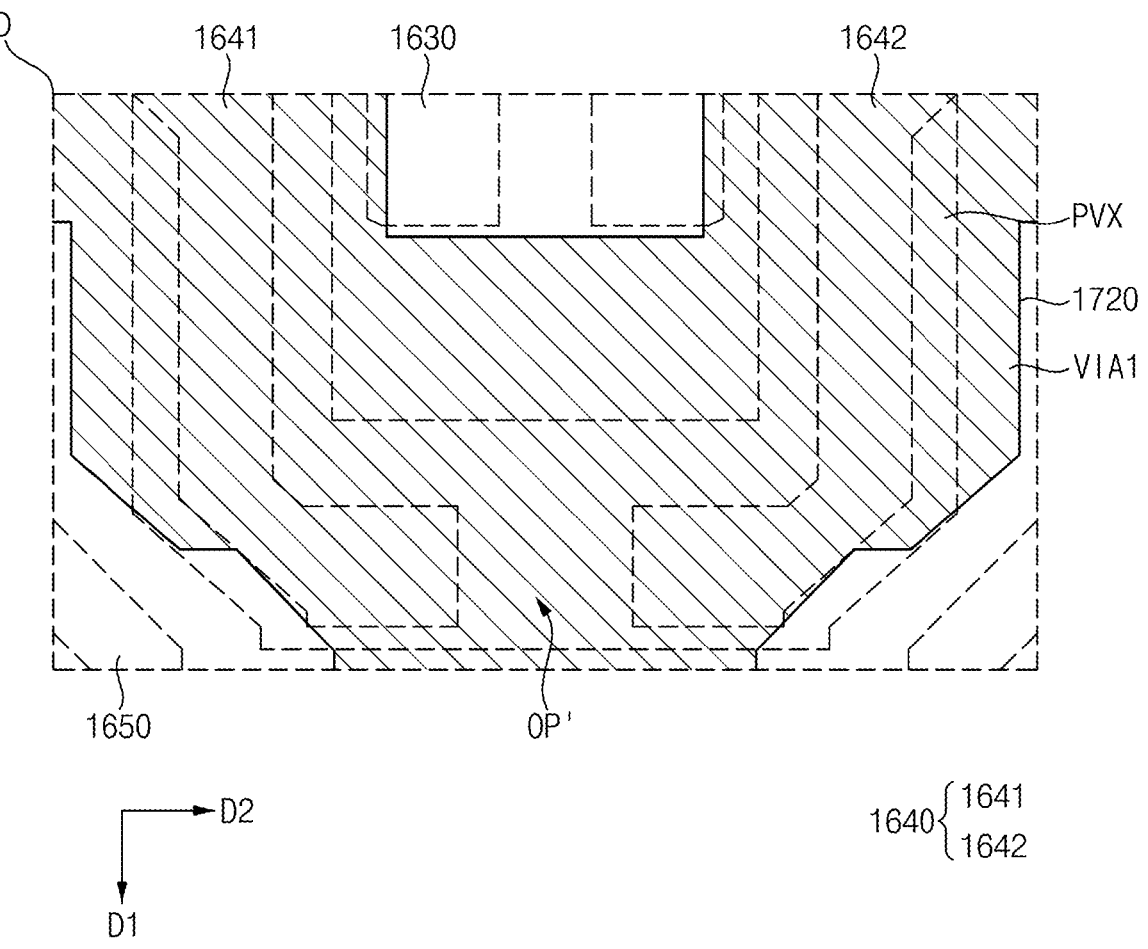

Referring to FIGS. 18 and 19, the fifth conductive pattern 1700 may be disposed on the first via insulating layer VIA1 The fifth conductive pattern 1700 may include the second data connection electrode 1710, the driving voltage line 1720 and the second light emitting element connection electrode 1730.

In an embodiment, the driving voltage line 1720 may cover the opening OP' of the first via insulating layer VIA1 For example, the driving voltage line 1720 may contact the passivation layer PVX in the opening OP', and may overlap each of the first gate connection electrode 1641 and the second gate connection electrode 1642 with the passivation layer PVX interposed therebetween.

In an embodiment, the driving voltage line 1720 and the first gate connection electrode 1641 may additionally form the third storage capacitor CST3 in an area where the driving voltage line 1720 and the first gate connection electrode 1641 overlap. The driving voltage line 1720 and the second gate connection electrode 1642 may additionally form the third storage capacitor CST3 in an area where the driving voltage line 1720 and the second gate connection electrode 1642 overlap. In other words, the driving voltage line 1720 may additionally form the third storage capacitor CST3 with each of the first gate connection electrode 1641 and the second gate connection electrode 1642 in the opening OP'.

The display device according to an embodiment of the disclosure may include the fourth conductive pattern 1600 including the first gate connection electrode 1641 and the second gate connection electrode 1642, the passivation layer PVX, the first via insulating layer VIA1 and the fifth conductive pattern 1700 including the driving voltage line 1720. The opening OP' exposing the passivation layer PVX overlapping each of the first gate connection electrode 1641 and the second gate connection electrode 1642 may be defined in the first via insulating layer VIA1 The opening OP' may have the U-shape in which the lower flat surface is cut off in plan view, and the driving voltage line 1720 may overlap each of the first gate connection electrode 1641 and the second gate connection electrode 1642 with the passivation layer PVX interposed therebetween in the opening OP'. As the driving voltage line 1720 and each of the first gate connection electrode 1641 and the second gate connection electrode 1642 additionally form the third storage capacitor CST3, a capacity of the storage capacitor CST of the first transistor T1 may be maximized. Accordingly, a voltage of the first transistor T1 may be stabilized, and display quality of the display device may be improved.

The disclosure can be applied to various display devices. For example, the disclosure is applicable to various display devices such as display devices for vehicles, ships and aircraft, portable communication devices, display devices for exhibition or information transmission, medical display devices, and/or the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the disclosure. Accordingly, all such modifications are intended to be included within the scope of the disclosure.

What is claimed is:

1. A display device, comprising:
a first electrode disposed on a substrate and extending in a first direction;
a via insulating layer disposed on the first electrode and including an opening exposing at least a portion of the first electrode; and
a second electrode disposed on the first electrode and the via insulating layer and overlapping the first electrode in the opening.

2. The display device of claim 1, further comprising:
a scan line disposed between the substrate and the first electrode and extending in a second direction intersecting the first direction,
wherein the scan line intersects the first electrode in plan view.

3. The display device of claim 2, wherein the opening extends in the first direction.

4. The display device of claim 3, wherein the opening intersects the scan line in plan view.

5. The display device of claim 1, further comprising:
a passivation layer disposed on the first electrode and overlapping the first electrode.

6. The display device of claim 5, wherein the second electrode contacts the passivation layer in the opening.

7. The display device of claim 1, further comprising:
a gate electrode disposed on the substrate; and
a capacitor electrode disposed on the gate electrode,
wherein the first electrode overlaps the gate electrode and the capacitor electrode.

8. The display device of claim 7, further comprising:
an insulating layer disposed on the gate electrode and overlapping the gate electrode;
a first active pattern disposed between the substrate and the gate electrode; and
a second active pattern disposed between the insulating layer and the first electrode.

9. The display device of claim 8, wherein
the first active pattern includes a silicon semiconductor, and
the second active pattern includes an oxide semiconductor.

10. The display device of claim 8, further comprising:
a lower pattern disposed between the substrate and the first active pattern.

18

11. A display device, comprising:
a first electrode disposed on a substrate and extending in a first direction;
a second electrode disposed on the substrate and spaced apart from the first electrode in a second direction intersecting the first direction;
a via insulating layer disposed on the first electrode and the second electrode, exposing at least a portion of each of the first electrode and the second electrode, and including an opening including a U-shape in which a lower flat surface is cut off in plan view; and
a third electrode disposed on the first electrode, the second electrode and the via insulating layer, and overlapping each of the first electrode and the second electrode in the opening.

12. The display device of claim 11, wherein the opening includes:
a first opening extending in the first direction and exposing at least a portion of the first electrode;
a second opening extending in the first direction, spaced apart from the first opening in the second direction, and exposing at least a portion of the second electrode; and
a third opening extending in the second direction, exposing at least a portion of each of the first electrode and the second electrode, and extending to the first opening and the second opening.

13. The display device of claim 12, wherein the opening extends from the first opening to the second opening along the third opening.

14. The display device of claim 12, further comprising:
a scan line disposed between the substrate and the first electrode and extending in the second direction,
wherein the scan line intersects each of the first electrode and the second electrode in plan view.

15. The display device of claim 14, wherein each of the first opening and the second opening intersects the scan line in plan view.

16. The display device of claim 11, further comprising:
a passivation layer disposed on the first electrode and the second electrode and overlapping the first electrode and the second electrode.

17. The display device of claim 16, wherein the third electrode contacts the passivation layer in the opening.

18. The display device of claim 11, further comprising:
a first gate electrode disposed on the substrate;
a second gate electrode disposed on the substrate and spaced apart from the first gate electrode in the second direction;
a first capacitor electrode disposed on the first gate electrode; and
a second capacitor electrode disposed on the second gate electrode, wherein
the first electrode overlaps the first gate electrode and the first capacitor electrode, and
the second electrode overlaps the second gate electrode and the second capacitor electrode.

19. The display device of claim 18, further comprising:
an insulating layer disposed on the first gate electrode and the second gate electrode and overlapping the first gate electrode and the second gate electrode.

20. The display device of claim 19, further comprising:
a first active pattern disposed between the substrate and the first gate electrode and including a silicon semiconductor; and
a second active pattern disposed between the insulating layer and the first electrode and including an oxide semiconductor.

* * * * *